United States Patent
Yokogawa et al.

(10) Patent No.: US 9,490,104 B2
(45) Date of Patent: Nov. 8, 2016

(54) HEAT TREATMENT APPARATUS

(75) Inventors: Ken'etsu Yokogawa, Tsurugashima (JP); Masatoshi Miyake, Kamakura (JP); Takashi Uemura, Kudamatsu (JP); Masaru Izawa, Hino (JP); Satoshi Sakai, Yokohama (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 448 days.

(21) Appl. No.: 13/550,638

(22) Filed: Jul. 17, 2012

(65) Prior Publication Data

US 2013/0112670 A1    May 9, 2013

(30) Foreign Application Priority Data

Nov. 8, 2011  (JP) ................................. 2011-244083
Apr. 16, 2012 (JP) ................................. 2012-092883

(51) Int. Cl.
| B23K 9/00 | (2006.01) |
| H01J 37/32 | (2006.01) |
| H01L 21/324 | (2006.01) |
| H01L 21/67 | (2006.01) |

(52) U.S. Cl.
CPC .... H01J 37/32091 (2013.01); H01J 37/32522 (2013.01); H01L 21/324 (2013.01); H01L 21/67115 (2013.01)

(58) Field of Classification Search
USPC ................ 219/121.58, 121.43, 443.1, 446.7; 118/723, 724, 725; 156/345.52
See application file for complete search history.

(56) References Cited

U.S. PATENT DOCUMENTS

| 4,687,895 | A  | * | 8/1987  | Chitre ..................... H05B 6/78 219/388 |
| 4,922,079 | A  | * | 5/1990  | Bowen et al. ................. 219/415 |
| 6,074,512 | A  | * | 6/2000  | Collins ................. C23C 16/517 118/723 AN |
| 6,227,140 | B1 | * | 5/2001  | Kennedy ............. C23C 16/4401 118/723 R |
| 6,632,325 | B2 | * | 10/2003 | Lingampalli ............. 156/345.51 |
| 6,815,365 | B2 | * | 11/2004 | Masuda et al. ............... 438/710 |
| 7,169,256 | B2 | * | 1/2007  | Dhindsa ............ H01J 37/32082 118/723 E |
| 7,189,940 | B2 | * | 3/2007  | Kumar et al. ........... 219/121.43 |
| 7,605,023 | B2 | * | 10/2009 | Takayama et al. ........... 438/149 |
| 7,649,186 | B2 | * | 1/2010  | Kabuki .................. B82Y 10/00 250/461.1 |
| 7,993,489 | B2 | * | 8/2011  | Matsumoto et al. .... 156/345.47 |

(Continued)

FOREIGN PATENT DOCUMENTS

| JP | H01-243530 A | 9/1989 |
| JP | H07-231073 A | 8/1995 |

(Continued)

OTHER PUBLICATIONS

Office Action, mailed Feb. 24, 2015, which issued during the prosecution of Japanese Application No. 2011-089981, which corresponds to the present application (English translation attached).

(Continued)

*Primary Examiner* — David Angwin
*Assistant Examiner* — Frederick Calvetti
(74) *Attorney, Agent, or Firm* — Baker Botts L.L.P.

(57) ABSTRACT

Provided is a heat treatment apparatus that is high in thermal efficiency and can reduce surface roughness of a substrate to be treated even when a specimen is heated at 1200° C. or higher.
The heat treatment apparatus heating the specimen includes a heating plate heated by plasma formed in an area of a gap to heat the specimen.

5 Claims, 10 Drawing Sheets

(56) References Cited

U.S. PATENT DOCUMENTS

| | | | |
|---|---|---|---|
| 8,569,647 B2* | 10/2013 | Miyake et al. | 219/121.54 |
| 8,697,197 B2* | 4/2014 | Savas et al. | 427/569 |
| 2002/0038688 A1* | 4/2002 | Nakano et al. | 156/345 |
| 2002/0073925 A1* | 6/2002 | Noble | C23C 8/36 118/723 ME |
| 2005/0264218 A1* | 12/2005 | Dhindsa et al. | 315/111.21 |
| 2006/0220027 A1 | 10/2006 | Takahashi et al. | |
| 2008/0121824 A1* | 5/2008 | Kabuki et al. | 250/504 R |
| 2008/0178805 A1* | 7/2008 | Paterson | H01J 37/32091 118/723 I |
| 2008/0207008 A1 | 8/2008 | Peelamedu et al. | |
| 2008/0236490 A1* | 10/2008 | Paterson | H01J 37/32091 118/723 I |
| 2008/0310042 A1* | 12/2008 | Suzuki | C23C 28/00 359/883 |
| 2010/0024732 A1* | 2/2010 | Mokhlesi et al. | 118/724 |
| 2011/0005682 A1* | 1/2011 | Savas | C23C 16/24 156/345.34 |
| 2011/0006040 A1* | 1/2011 | Savas | C23C 16/24 216/71 |
| 2012/0000608 A1* | 1/2012 | Kellogg | H01J 37/32091 156/345.43 |

FOREIGN PATENT DOCUMENTS

| | | | |
|---|---|---|---|
| JP | 2006-269671 A | | 10/2006 |
| JP | 2009-32774 | | 2/2009 |
| JP | 2009-231341 | | 10/2009 |
| JP | 2010-34481 | | 2/2010 |
| JP | 2010034481 | * | 2/2010 |
| JP | 2010-517294 | | 5/2010 |
| KR | 1999-0050038 | * | 5/1999 |
| KR | 10-2009-0113313 | | 10/2009 |
| WO | WO 2005/076327 A1 | | 8/2005 |

OTHER PUBLICATIONS

Office Action, mailed Jan. 5, 2016, which issued during the prosecution of Japanese Patent Application No. 2012-092883, which corresponds to the present application (a full English translation attached).

* cited by examiner

HEAT TREATMENT APPARATUS

CLAIM OF PRIORITY

This application is based upon and claims the benefit of priority from the prior Japanese Patent Application No. 2011-244083 filed on Nov. 8, 2011, Application No. 2012-092883 filed on Apr. 16, 2012, the entire contents of which are incorporated herein by reference.

BACKGROUND OF THE INVENTION

1. Field of the Invention

The present invention relates to a semiconductor manufacturing apparatus for manufacturing a semiconductor device, and more particularly, to a heat treatment technology of performing activation annealing or repair annealing of defects and oxidation of the surface after doping of impurities performed in order to conductively control a semiconductor substrate.

2. Description of the Related Art

In recent years, introduction of a new material having a wideband gap such as silicon carbide (hereinafter, referred to as SiC) as a substrate material of a power semiconductor device has been expected. SiC which is a wideband gap semiconductor has a more excellent physical property than silicon (hereinafter, referred to as Si) such as a high insulation breakdown electric field, a high saturated electron velocity, and high thermal conductivity. In that the wideband gap semiconductor, SiC is a high insulation breakdown electric field material, a device can be thinned or doped with high concentration, and a device having high resisting pressure and low resistance can be fabricated. Further, since a band gap is large, thermal excitation electrons can be suppressed and a stable operation can be achieved at a high temperature in that a heat dissipation ability is high by high thermal conductivity. Accordingly, when the SiC power semiconductor device is implemented, significant efficiency improvement and enhanced performance of various power and electric equipments such as devices for power transportation and conversion, an industrial power device and home electric appliances can be expected.

A process of manufacturing various power devices by using SiC in the substrate is substantially the same as that of a case in which Si is used in the substrate. However, a heat treatment process may be mentioned as a significantly different process. The typical heat treatment process is activation annealing after ion implantation of impurities, which is performed for the purpose of conductively controlling the substrate. In the case of a Si device, the activation annealing is performed at a temperature in the range of 800 to 1200° C. Meanwhile, in the case of SiC, a temperature in the range of 1200 to 2000° C. is required due to a material characteristic thereof.

As an annealing apparatus for the SiC substrate, for example, a resistance heating furnace disclosed in Japanese Patent Application Laid-Open Publication No. 2009-32774 has been known. Further, in addition to the resistance heating furnace type, for example, an induction heating type annealing apparatus disclosed in Japanese Patent Application Laid-Open Publication No. 2010-34481 has been known. Japanese Patent Application Laid-Open Publication No. 2009-231341 discloses a method of installing a cover exposing SiC in a part facing the SiC substrate as a method for suppressing SiC surface roughness by annealing. Japanese Patent Application Laid-Open Publication No. 2010-517294 discloses an apparatus for heating a wafer through a metallic sheath by atmospheric pressure plasma generated by a microwave.

SUMMARY OF THE INVENTION

When heating of 1200° C. or higher is performed in the resistance heating furnace disclosed in Japanese Patent Application Laid-Open Publication No. 2009-32774, problems described below become remarkable.

A first problem lies in thermal efficiency. Since radiation is dominant as heat dissipation from a furnace body and a radiation amount is increased in proportion to biquadrate of the temperature, energy efficiency required for heating extremely deteriorates when a heating area is large. In the case of the resistance heating furnace, a double pipe structure is generally used in order to avoid contamination from a heater and the heating area is enlarged. Since a specimen to be heated gets away from a heat source (heater) by a double pipe, a heater unit needs to be at a higher temperature than the temperature of the specimen to be heated, also causing the efficiency to significantly deteriorate. Due to the same reason as above, a heat capacity of a heated area becomes very large and it takes a time for the temperature to rise or drop. Accordingly, a throughput deteriorates in that a time required from carry-in up to carry-out of the specimen to be heated is lengthened, and further, a presence time of the specimen to be heated under a high-temperature environment is lengthened, and as a result, surface roughness of the specimen to be heated described below is increased.

A second problem lies in consumption of a furnace material. As the furnace material, a material which can be resistant to 1200 to 2000° C. is limited, and a material having a high melting point and high purity is required. A material which may be used for a SiC substrate is graphite or SiC itself. In general, a material in which the surface of a SiC sintered body or a graphite base is coated with SiC by a chemical vapor deposition method. The materials are generally high-priced, and when the furnace body is large, a large amount of cost is required for replacement. As the temperature is high, the life-span of the furnace body is shortened, and as a result, a replacement cost is generally larger than that of a Si process.

A third problem lies in surface roughness accompanied by evaporation of the specimen to be heated. In heating at approximately 1800° C., Si is selectively evaporated from the surface of SiC which the specimen to be heated and the surface roughness is generated or doped impurities are removed, and as a result, a required device characteristic cannot be acquired. In regard to the surface roughness of the specimen to be heated accompanied by the high temperature, a method of previously forming a carbon film on the surface of the specimen to be heated and using the formed carbon film as a protection film while heating is used in the related art. However, in the method in the related art, forming and removing the carbon film are required in different processes for heat treatment, the number of processes increases, and the cost increases.

Meanwhile, in the induction heating type disclosed in Japanese Patent Application Laid-Open Publication No. 2010-34481, heating is performed by flowing induction current in a specimen to be heated or an installation means of installing the specimen to be heated by a radio-frequency, and the induction heating type has higher thermal efficiency than the above resistance heating furnace type. However, in the case of induction heating, heating efficiency for the specimen to be heated is not particularly high in that when electric resistivity of the specimen to be heated is low, the induction current required for heating increases and heat loss in an induction coil cannot be disregarded.

In the induction heating type, since heating uniformity is determined by the induction current that flows in the specimen to be heated or the installation means of installing the specimen to be heated, the heating uniformity cannot be sufficiently acquired on a planar Circular plate used to manufacture the device. When the heating uniformity is bad, the heated specimen may be broken due to thermal stress while rapid heating. As a result, the throughput deteriorates from a necessity to use the temperature rising speed so as not to generate the stress the temperature rising speed. Similarly as the resistance furnace heating type, processes of generating and removing a cap film to prevent Si evaporation from the SiC surface at an ultrahigh temperature are additionally required.

In the method of preventing SiC surface roughness disclosed in Japanese Patent Application Laid-Open Publication No. 2009-231341, a Si atom is separated from the SiC substrate surface by evaporation under a high-temperature environment, but since the Si atom is evaporated even from an opposed surface, the Si atom emitted from the opposed surface is introduced into a part after Si on the SiC substrate surface is separated, thereby preventing the surface roughness of the SiC substrate surface. As a result, a cover disclosed in Japanese Patent Application Laid-Open Publication No. 2009-231341 is just used as a supply source of the Si atom in heating by the induction heating coil or the resistance heating heater.

The annealing apparatus disclosed in Japanese Patent Application Laid-Open Publication No. 2010-517294 is different from the related art described above and adopts a type of exposing the specimen directly to atmospheric-pressure plasma generated by a microwave and heating the generated specimen is adopted, but an area where the plasma is generated is large, and as a result, the heating efficiency is bad.

In the case where the plasma is used as a heating source, when the specimen is exposed directly to the plasma and heated, motion energy that damages a crystal surface is generally 10 electron volt or higher. Ions accelerated over 10 electron volt damages the specimen. Therefore, energy of ions incident in the specimen needs to be set to 10 electron-volt or lower. As a result, a generation condition of the plasma is limited.

The present invention has been made in an effort to provide a heat treatment apparatus that is high in thermal efficiency and can reduce surface roughness of a substrate to be treated even when a specimen is heated at 1200° C. or higher.

There is provided a heat treatment apparatus heat-treating a specimen which includes a heating plate for heating the specimen by being heated by plasma in an embodiment of this invention.

According to the present invention, thermal efficiency is high and surface roughness of a substrate to be treated can be reduced.

BRIEF DESCRIPTION OF THE DRAWINGS

FIG. 2 is a cross-sectional view of a principal part of a heating treatment chamber of the heat treatment apparatus according to the first embodiment, in which

FIG. 7 is a cross-sectional view of a principal part of a heating treatment chamber of the heat treatment apparatus according to the third embodiment, in which

DETAILED DESCRIPTION OF THE PREFERRED EMBODIMENTS

Figure 1:
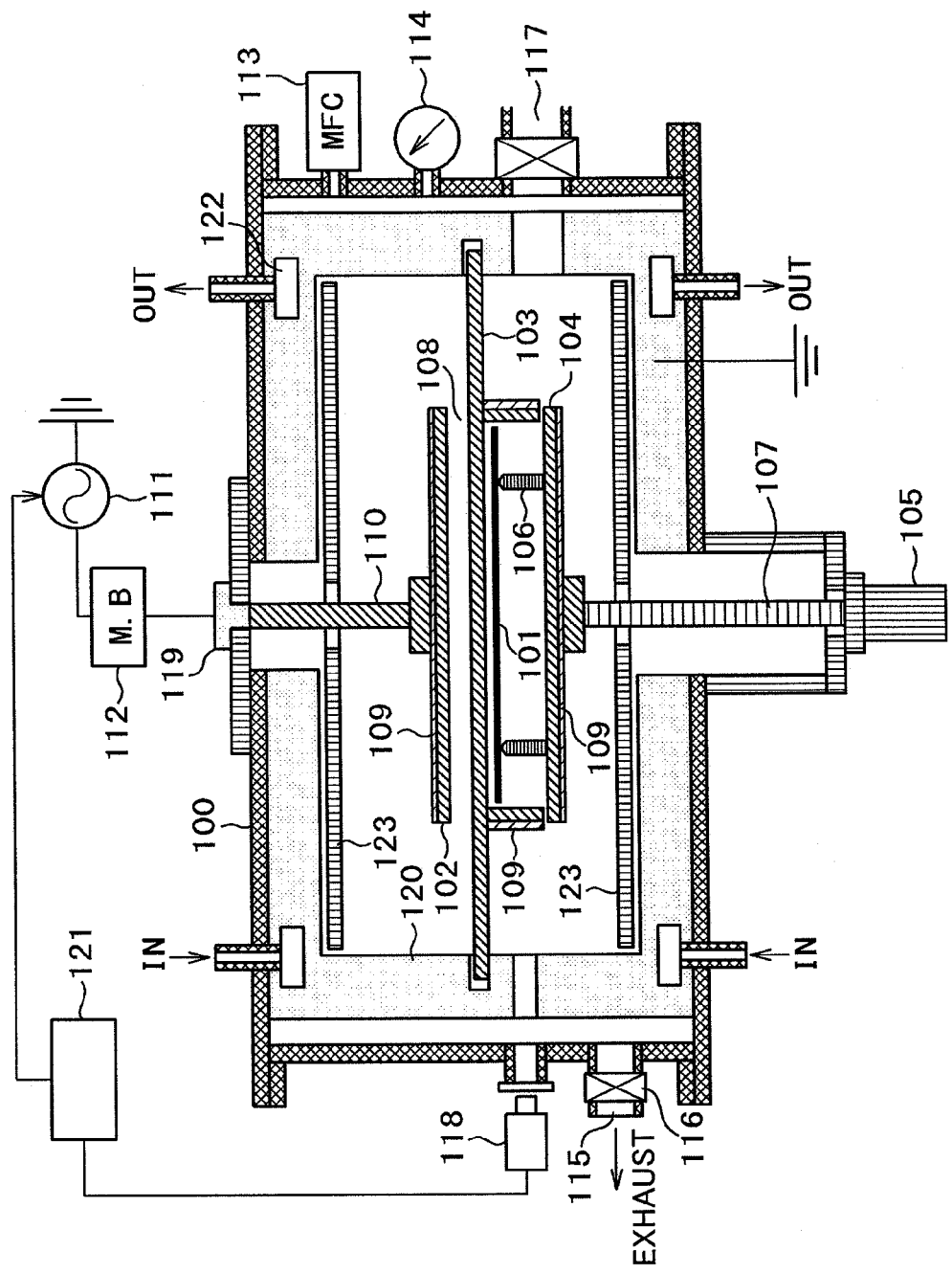
FIG. 1 is a basic configuration diagram of a heat treatment apparatus according to a first embodiment.

Hereinafter, each embodiment of the present invention will be described with reference to the accompanying drawings.

First Embodiment

A basic configuration in a heat treatment apparatus according to the present invention will be described with reference to FIG. 1.

The heat treatment apparatus of the embodiment includes a heating treatment chamber 100 that heats a specimen 101 to be heated by using plasma.

The heating treatment chamber 100 includes an upper electrode 102, a lower electrode 103 opposed to the upper electrode 102 and serving as a heating plate, a specimen stage 104 having a support pin 106 supporting the specimen 101 to be heated, a reflection mirror (a first radiant heat suppressing member) 120 reflecting radiant heat, a radio-frequency power supply 111 supplying radio-frequency power for generating plasma to the upper electrode 102, a gas introduction means 113 supplying gas into the heating treatment chamber 100, and a vacuum valve 116 adjusting pressure in the heating treatment chamber 100.

The specimen 101 to be heated is supported on the support pin 106 of the specimen stage 104 and comes close to a lower part of the lower electrode 103. The lower electrode 103 contacts the reflection mirror 120 on an outer periphery and does not contact the specimen 101 to be heated and the specimen stage 104. In the embodiment, as the specimen 101 to be heated, a 4 inch (φ100 mm) SiC substrate is used.

The diameters and thicknesses of the upper electrode 102 and the specimen stage 104 are set to 120 mm and 5 mm, respectively.

Figure 2:
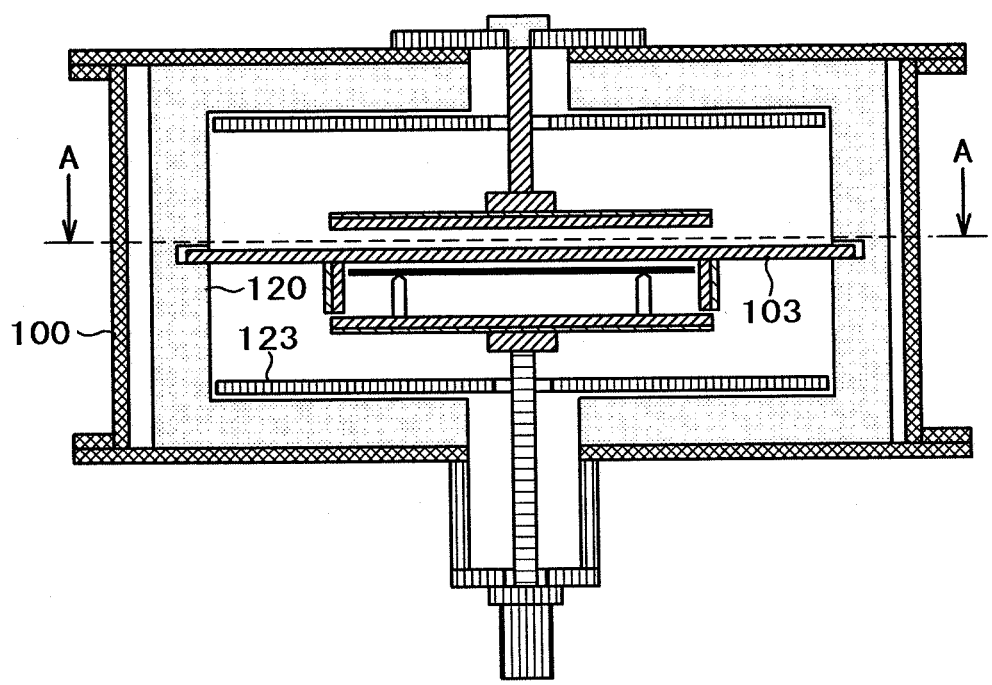
Figure 2A:
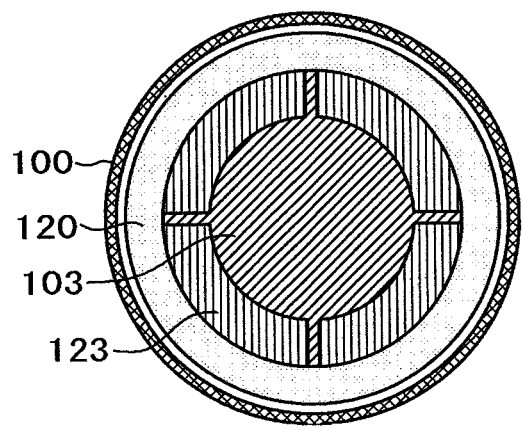
FIG. 2A is one example of a top view viewed from section AA.

Meanwhile, the diameter of the lower electrode 103 is equal to or more than the inner diameter of the reflection mirror 120 and the thickness thereof is set to 2 mm. The lower electrode 103 has a member having an inner cylindrical shape to cover the side of the specimen 101 to be heated at an opposite side to a surface opposed to the upper electrode 102. A top view of section AA of the cross-sectional view of the apparatus illustrated in FIG. 2 is illustrated in FIG. 2A. The lower electrode 103 is constituted by a disk-shaped member having substantially the same diameter as the upper electrode 102 and four beams placed at regular intervals, which connect the disk-shaped member and the reflection mirror 120, as illustrated in FIG. 2A. A gap is formed between the beams (at a portion without the beam) on the outer periphery of the disk-shaped member, but a shape in which a protection quartz plate 123 in a lower part is exposed from the gap is illustrated in FIG. 2A. The number, cross-sectional areas, and thicknesses of the beams may be determined in consideration of the strength of the lower electrode 103 and heat dissipation from the lower electrode 103 to the reflection mirror 120.

When the lower electrode 103 has a structure held by the reflection mirror 120 by the thin beams as illustrated in FIG. 2A, heat of the lower electrode 103 heated by plasma may be prevented from being transferred to the reflection mirror 120, and as a result, the lower electrode 103 serves as a heating plate having high thermal efficiency. Plasma generated between the upper electrode 102 and the lower electrode 103 is diffused to the vacuum valve 116 from a space between the beams, but since the specimen 101 to be heated is covered with the member having the inner cylindrical shape, the specimen 101 to be heated may not be exposed to plasma.

Figure 2B:
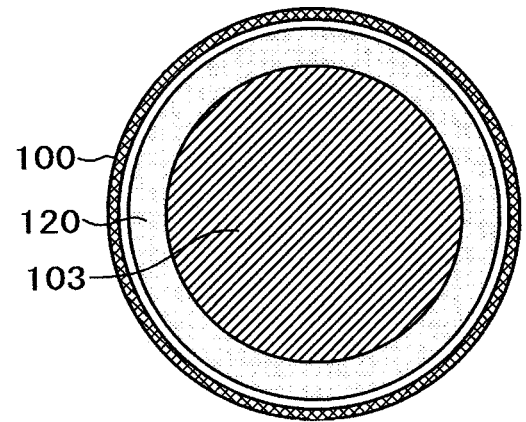
FIG. 2B is another example of the top view viewed from section AA.

A modified example of the lower electrode 103 is illustrated in FIG. 2B. When the lower electrode 103 has a structure in which no beam is installed by increasing the diameter of the disk-shaped member as illustrated in FIG. 2B, the heating treatment chamber 100 may be separated into a plasma generation chamber generating plasma and a heating chamber heating the specimen 101 to be heated, and thus the specimen 101 to be heated is not exposed to plasma and gas for generating plasma may be charged in only the plasma generation chamber. As a result, consumption of gas may be saved as compared with the structure of the lower electrode 103 according to the embodiment. However, as described above, the structure of the lower electrode 103 according to the embodiment illustrated in FIG. 2A is more excellent than the structure of FIG. 2B in the function as the heating plate.

The upper electrode 102, the lower electrode 103, the specimen stage 104, and the support pin 106 are used, which is acquired by depositing SiC on the surface of a graphite base by a chemical vapor deposition method (hereinafter, referred to as a CVD method).

A gap 108 between the lower electrode 103 and the upper electrode 102 is set to 0.8 mm. The specimen 101 to be heated has a thickness in the range of approximately 0.5 mm to 0.8 mm and a circumferential angle portion of each of portions of the upper electrode 102 and the lower electrode 103 that are opposed to each other is processed in a tapered or round shape. This is to suppress localization of plasma by electric field concentration at the angle portion of each of the upper electrode 102 and the lower electrode 103.

The specimen stage 104 is connected with a vertical mechanism (an up-down mechanism) 105 through a shaft 107 and the specimen 101 to be heated may be transferred or the specimen 101 to be heated may come close to the lower electrode 103 by operating the vertical mechanism 105. A detailed description will be made below. The shaft 107 is made of an alumina material.

Radio-frequency power is supplied from the radio-frequency power supply 111 to the upper electrode 102 through an upper feed line 110. In the embodiment, as a frequency of the radio-frequency power supply 111, 13.56 MHz is used. The lower electrode 103 is in conduction with the reflection mirror 120 through the beams. The lower electrode 103 is grounded through the reflection mirror 120. The upper feed line 110 is made of graphite which is a constituent material of the upper electrode 102 and the lower electrode 103.

A matching circuit 112 (further, M.B of FIG. 1 is an abbreviation of Matching Box) is placed between the radio-frequency power supply 111 and the upper electrode 102 and the radio-frequency power from the radio-frequency power supply 111 is configured to be efficiently supplied to plasma formed between the upper electrode 102 and the lower electrode 103.

Gas is configured to be introduced into the heating treatment chamber 100 where the upper electrode 102 and the lower electrode 103 are placed by the gas introduction means 113 in the range of 0.1 to 10 atmospheric pressure. The pressure of the introduced gas is monitored by a pressure detection means 114. The heating treatment chamber 100 is configured such that gas is exhausted by a vacuum pump connected to an exhaust port 115 and the vacuum valve 116.

The upper electrode 102, the lower electrode 103, and the specimen stage 104 in the heating treatment chamber 100 are configured to be surrounded by the reflection mirror 120. The reflection mirror 120 is configured by optically polishing an inner wall surface of a metallic base, and plating a polished surface with gold or depositing gold on the polished surface. A refrigerant path 122 is formed on the metallic base of the reflection mirror 120 and the temperature of the reflection mirror 120 is maintained constantly by making cooling water flow on the refrigerant path 122. Since radiant heat from the upper electrode 102, the lower electrode 103, and the specimen stage 104 is reflected by providing the reflection mirror (first radiant heat suppressing member) 120, thermal efficiency may be increased, but the reflection mirror 120 is not a requisite component of the present invention.

The protection quartz plate 123 is placed between the upper electrode 102 and the specimen stage 104, and the reflection mirror 120. The protection quartz plate 123 serves to prevent contamination of the surface of the reflection mirror 120 by emissions (sublimation of graphite) from the upper electrode 102, the lower electrode 103, and the specimen stage 104 which are at an ultra-high temperature and prevent contamination which may be mixed into the specimen 101 from the reflection mirror 120.

Figure 3:
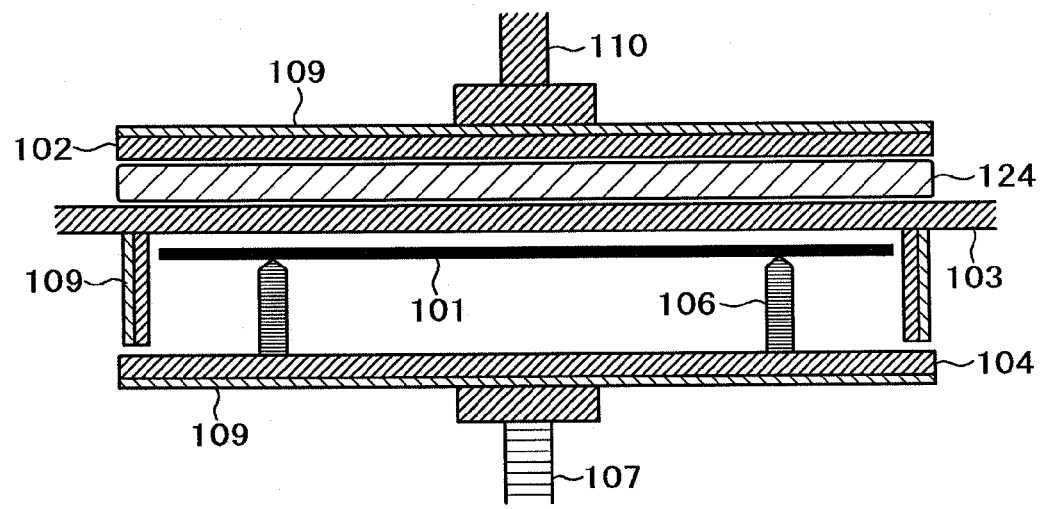
FIG. 3 is an enlarged diagram of a heating area in the heating treatment chamber of the heat treatment apparatus according to the first embodiment.

As illustrated in FIG. 3, a plate material 109 having the high melting point and low emissivity or coating (a second radiant heat suppressing member) 109 having the high melting point and low emissivity is placed on an opposite side to the surface of the upper electrode 102 contacting plasma 124, outer surfaces of members having an inner cylindrical shape to cover the sides of the specimens 101 to be heated of the lower electrode 103, and the bottom of the specimen stage 104. Since the radiant heat from the upper electrode 102, the lower electrode 103, and the specimen stage 104 is reduced by providing the plate material 109 having the high melting point and low emissivity or the coating 109 having the high melting point and low emissivity, thermal efficiency may be increased.

When a treatment temperature is low, the plate material 109 having the high melting point and low emissivity or the coating 109 needs not particularly be provided. In the case of ultrahigh-temperature treatment, any one of the reflection mirror 120 and the plate material 109 having the high melting point and low emissivity or the coating 109 having the high melting point and low emissivity is provided or both are provided, such that the specimen may be heated at a predetermined temperature. The temperature of the lower electrode 103 or the specimen stage 104 is measured by a radiation thermometer 118. The coating 109 may be a separate member independent from the member such as the upper electrode 102, the lower electrode 103, or the specimen stage 104 and may be acquired by coating the surface of the member with a material having the high melting point or low emissivity. In the embodiment, a plate in which the graphite base is coated with tantalum carbide (TaC) is used as the plate material 109 having the high melting point and low emissivity or the coating 109 having the high melting point and low emissivity performed in the upper electrode 102, the lower electrode 103, and the specimen stage 104.

Subsequently, a basic operation example of the heat treatment apparatus of the present invention will be described with reference to FIG. 1.

First, He gas in the heating treatment chamber 100 is exhausted from the exhaust port 115, such that the heating treatment chamber 100 is in a high vacuum state. When exhaustion is sufficiently terminated, the exhaust port 115 is closed and gas is introduced from the gas introduction means 113 to control the inside of the heating treatment chamber 100 at 0.6 atmospheric pressure. In the embodiment, as the gas introduced into the heating treatment chamber 100, He is used.

The specimen 101 to be heated preliminarily heated at 400° C. in a spare chamber (not illustrated) is transported from a transportation port 117 and supported on the support pin 106 of the specimen stage 104. A method of supporting the specimen 101 to be heated on the support pin 106 will be described in detail below.

After the specimen 101 to be heated is supported on the support pin 106 of the specimen stage 104, the specimen stage 104 is lifted up to a predetermined position by the vertical mechanism 105. In the embodiment, a position where a distance between the bottom of the lower electrode 103 and the surface of the specimen 101 to be heated is 0.5 mm is set as the predetermined position.

In the embodiment, the distance between the bottom of the lower electrode 103 and the surface of the specimen 101 to be heated is set to 0.5 mm, but the distance may be 0.1 mm to 2 mm. Heating efficiency is increased as the specimen 101 to be heated comes close to the bottom of the lower electrode 103, but the specimen 101 to be heated comes close to the bottom of the lower electrode 103, the heating efficiency is improved, but a risk that the lower electrode 103 and the specimen 101 to be heated will contact each other is increased or a problem such as contamination, and the like occurs, and as a result, the distance is undesirably less than 0.1 mm. When the distance is more than 2 mm, the heating efficiency is decreased and radio-frequency power required for heating is increased, which is not desirable. As a result, closeness in the present invention represents the distance from 0.1 to 2 mm.

After the specimen stage 104 is elevated at a predetermined position, the radio-frequency power from the radio-frequency power supply 111 is supplied to the upper electrode 102 through the matching circuit 112 and the power introduction terminal 119 and plasma is generated in the gap 108 to thereby heat the specimen 101 to be heated. Energy of the radio-frequency power is absorbed in electrons in plasma and further, atoms or molecules of raw gas are heated by collision of the electrons. Ions generated by ionization are accelerated at an electric potential difference generated on a sheath of the surface contacting plasma of the upper electrode 102 and the lower electrode 103 and are incident in the upper electrode 102 and the lower electrode 103 while colliding with the raw gas. By the collision process, the temperature of gas charged between the upper electrode 102 and the lower electrode 103 or the temperatures of the surfaces of the upper electrode 102 and the lower electrode 103 may be increased.

In particular, around the atmospheric pressure as in the embodiment, since the ions frequently collide with the raw gas at the time of passing through the sheath, it is considered that the raw gas charged between the upper electrode 102 and the lower electrode 103 may be efficiently heated. Herein, the pressure is in the range of 0.1 to 1 atmospheric pressure around the atmospheric pressure.

As a result, the raw gas may be easily heated up to approximately 1200 to 2000° C. By contacting the heated high-temperature gas with the upper electrode 102 and the lower electrode 103, the upper electrode 102 and the lower electrode 103 are heated. Some of neutral gas excited by collision of the electrons is deexcited in association with light emission, and the upper electrode 102 and the lower electrode 103 are heated even by light emission at this time. The specimen stage 104 and the specimen 101 to be heated are heated by radiation from the upper electrode 102 and the lower electrode 103 in which the high-temperature gas is mixed or which are heated.

Herein, the lower electrode 103 serving as the heating plate comes close to an upper part of the specimen 101 to be heated, such that the lower electrode 103 is heated by gas heated by plasma at the high temperature and thereafter, the specimen 101 to be heated is heated, and as a result, the effect that the specimen 101 to be heated is uniformly heated is obtained. The specimen stage 104 is installed below the lower electrode 103, such that a uniform electric field may be formed between the lower electrode 103 and the upper electrode 102 and uniform plasma may be generated, regardless of the shape of the specimen 101 to be heated. By placing the specimen 101 to be heated below the lower electrode 103, the specimen 101 to be heated is not exposed directly to the plasma formed in the gap 108. Even when arc discharge is performed from glow discharge, it is possible to avoid damage to the specimen 101 to be heated in that discharge current flows on the lower electrode 103 without passing through the specimen 101 to be heated.

The temperature of the lower electrode 103 or the specimen stage 104 which is being heated is measured by the radiation thermometer 118 and the output of the radio-frequency power supply 111 is controlled so that the temperature of the lower electrode 103 or the specimen stage 104 is a predetermined temperature by a control unit 121 by using a measured value, and as a result, the temperature of the specimen 101 to be heated may be controlled with high precision. In the embodiment, the inputted radio-frequency power is maximally set to 20 kW.

In order to efficiently increase the temperatures of the upper electrode 102, the lower electrode 103, and the specimen stage 104 (including the specimen 101 to be heated), it is required to suppress heat-transfer of the upper feed line 110, heat-transfer through an He gas atmosphere, and radiation (visible-ray range from infrared rays) from a high-temperature range. In particular, in an ultrahigh temperature state at 1200° C. or higher, an influence of heat dissipation by radiation is very large and reduction of radiation loss is required to improve heating efficiency. In the case of the radiation loss, a radiation amount is increased in proportion to biquadrate of an absolute temperature.

In order to suppress the radiation loss, the plate material 109 having the high melting point and low emissivity or the coating 109 having the high melting point and low emissivity is placed in the upper electrode 102, the lower electrode 103, and the specimen stage 104, as described above in the embodiment. As the material having the high melting point and low emissivity, TaC is used. The emissivity of TaC is in the range of approximately 0.05 to 0.1 and infrared rays accompanied with radiation are reflected at reflectivity of approximately 90%. The radiation loss from the upper electrode 102, the lower electrode 103, and the specimen stage 104 is suppressed and the specimen 101 to be heated may be heated at the ultrahigh temperature in the range of approximately 1200 to 2000° C. with high thermal efficiency, by using the plate material 109 having the high melting point and low emissivity or the coating 109 having the high melting point and low emissivity.

TaC is placed while not being exposed directly to plasma and impurities included in Ta or TaC are configured not to be mixed into the specimen 101 to be heated during heating. An increase in heat capacity of a heated portion may be minimized in that a heat capacity of the plate material 109 having the high melting point and low emissivity or the coating 109 having the high melting point and low emissivity, which is made of TaC is very small. Therefore, the speeds at which the temperature rises and drops are not also decreased by placing the plate material 109 having the high melting point and low emissivity or the coating 109 having the high melting point and low emissivity.

Plasma of a heating source is made to plasma in a glow discharge range to form plasma uniformly dispersed between the upper electrode 102 and the lower electrode 103 and it is possible to uniformly heat the specimen 101 to be heated which is planar by heating the specimen 101 to be heated by using uniform and planar plasma as a heat source.

Although the temperature of the specimen 101 to be heated is rapidly increased in that the specimen 101 to be heated may be heated planarly and uniformly, a risk which occurs due to a breakage accompanied by temperature nonuniformity in the specimen 101 to be heated is low. The temperature may be rapidly increased and decreased as described above and a time required for a series of heating treatments may be shortened. A throughput of the heating treatment may be improved by the effect or presence of the specimen 101 to be heated under a high-temperature atmosphere beyond necessity may be suppressed and SiC surface roughness accompanied by a high temperature may be reduced.

When the heating treatment is terminated, the heated specimen 101 is carried out from the transportation port 117 in a step in which the temperature of the heated specimen 101 is decreased to 800° C. or lower and the subsequent specimen 101 to be heated is transported into the heating treatment chamber 100 to be supported on the support pin 106 of the specimen stage 104 and the heating treatment operation described above is repeated.

When the specimen 101 to be heated is replaced, a gas atmosphere at a specimen evacuation position (not illustrated) connected to the transportation port 117 is maintained at the same level as that in the heating treatment chamber 100, such that replacement of He in the heating treatment chamber 100 accompanied by replacement of the specimen 101 to be heated need not be performed, thereby reducing the amount of used gas.

Of course, since purity of He gas in the heating treatment chamber 100 may be decreased by repeating the heating treatment to some extent, He gas is regularly replaced in that case. When He gas is used as discharge gas, He gas is relatively high-priced gas, and as a result, the amount of used gas is maximally reduced, thereby suppressing a running cost. The amount of He gas introduced during heating treatment is set as a minimum flow required to maintain the purity of gas during treatment to thereby reduce the amount of used gas. A cooling time of the heated specimen 101 may be shortened by introducing He gas. That is, after the heating treatment is terminated (after discharge is terminated), the amount of He gas is increased to thereby shorten the cooling time by a cooling effect of He gas.

The heated specimen 101 is carried out under 800° C. or lower as described above, but a transportation arm having high heat resistance is used, such that the heated specimen 101 may be carried out even under 800 to 2000° C. and a standby time may be shortened.

In the embodiment, the gap 108 between the upper electrode 102 and the lower electrode 103 is set to 0.8 mm, but the same effect may be achieved even in the range of 0.1 to 2 mm. Discharge is available even in the case of a gap which is narrower than 0.1 mm, but a high-precision function is required to maintain parallelism between the upper electrode 102 and the lower electrode 103. Since alteration (roughness, and the like) of the surfaces of the upper electrode 102 and the lower electrode 103 influences the plasma, the gap narrower than 0.1 mm is not desirable. Meanwhile, in the case where the gap 108 is more than 2 mm, ignition performance of plasma deteriorates or radiation loss from a space between the gaps is increased, which is not desirable.

In the embodiment, the pressure in the heating treatment chamber 100 for generating plasma is set to 0.6 atmospheric pressure, but the same operation is available even under 10 atmospheric pressure or lower. When the pressure in the heating treatment chamber 100 is higher than 10 atmospheric pressure, it is difficult to generate uniform glow discharge.

In the embodiment, as the raw gas for generating plasma, He gas is used, but the same effect may be achieved even by using gas using inert gas such as Ar, Xe, Kr, or the like as a raw material in addition thereto. He gas used in the embodiment is excellent in plasma ignition performance or stability around the atmospheric pressure, but is high in thermal conductivity of gas and comparatively large in heat loss by the heat-transfer through the gas atmosphere. Meanwhile, gas having large mass such as Ar, Xe, Kr, or the like is low in thermal conductivity and thus is more advantageous than He gas in terms of thermal efficiency.

In the embodiment, as the plate material 109 having the high melting point and low emissivity or the coating 109 having the high melting point and low emissivity performed in the upper electrode 102, the lower electrode 103, and the specimen stage 104, the graphite base is coated with tantalum carbide (TaC), but the same effect may be achieved even by using tungsten carbide (WC), molybdenum carbide (MoC), tantalum (Ta), molybdenum (Mo), and tungsten (W) in addition thereto.

In the embodiment, graphite is used, in which the opposite side to the surfaces of the upper electrode 102, the lower electrode 103, and the specimen stage 104 contacting plasma is coated with silicon carbide by the CVD method, but the same effect may be achieved even by using single graphite, a member in which graphite is coated with pyrolytic carbon, a member in which the surface of graphite is vitrificated, and SiC (a sintered body, polycrystal, and single crystal). Graphite serving as the base of the upper electrode 102 or the lower electrode 103 or coating performed on the surface thereof desirably has high purity in terms of preventing contamination in the specimen 101.

In the embodiment, as the plate material 109 having the high melting point and low emissivity or the coating 109 having the high melting point and low emissivity, TaC is used, but the same effect may be achieved even by using other materials having high melting points (a melting point to endure the used temperature) and low emissivity. The same effect may be achieved by, for example, single tantalum (Ta), molybdenum (Mo), tungsten (W), or tungsten carbide (WC), and the like.

At the ultrahigh temperature, contamination from the upper feed line 110 may also influence the specimen 101. Therefore, in the embodiment, graphite as in the upper electrode 102 and the lower electrode 103 is used for even the upper feed line 110. Heat of the upper electrode 102 is transferred to the upper feed line 110 and thereafter, lost. Accordingly, heat-transfer from the upper feed line 110 needs to be requisitely minimized.

Therefore, a cross-sectional area of the upper feed line 110 formed by graphite needs to be small and the length thereof needs to be large, as possible. However, when the cross-sectional area of the upper feed line 110 is extremely small and the length thereof is excessively large, radio-frequency power loss is increased in the upper feed line 110 and heating efficiency of the specimen 101 deteriorates. As a result, in the embodiment, the cross-sectional area of the upper feed line 110 formed by graphite is set to 12 mm$^2$ and the length thereof is set to 40 mm based on the above viewpoint. The same effect is acquired even when the cross-sectional area of the upper feed line 110 is in the range of 5 to 30 mm$^2$ and the length of the upper feed line 110 is in the range of 30 to 100 mm.

Heat of the specimen stage 104 is transferred to the shaft 107 and thereafter, lost. Therefore, heat-transfer from the shaft 107 also needs to be requisitely minimized like the upper feed line 110. Therefore, a cross-sectional area of the shaft 107 formed by the alumina material is small as possible and the length thereof needs to be large. In the embodiment, the cross-sectional area and the length of the shaft 107 formed by the alumina material are set to be the same as those of the upper feed line 110 by considering the strength thereof.

In the embodiment, the radiation loss from the upper electrode 102, the lower electrode 103, and the specimen stage 104 is reduced by the plate material 109 having the high melting point and low emissivity or the coating 109 having the high melting point and low emissivity and further, radiant light is returned to the upper electrode 102, the lower electrode 103, and the specimen stage 104 by the reflection mirror 120 to thereby improve heating efficiency. However, even when only the plate material 109 having the high melting point and low emissivity or the coating 109 having the high melting point and low emissivity is performed in the upper electrode 102, the lower electrode 103, and the specimen stage 104, improvement of heating efficiency may be expected. Similarly, even when only the reflection mirror 120 is installed, improvement of heating efficiency may be expected. The protection quartz plate 123 is installed to expect the effect of contamination prevention and sufficient heating efficiency may be acquired without using the protection quartz plate 123.

In the embodiment, heat dissipation from the upper electrode 102, the lower electrode 103, and the specimen stage 104 that influences heating efficiency primarily includes (1) radiation, (2) heat-transfer under the gas atmosphere, and (3) heat-transfer from the upper feed line 110 and the shaft 107. When heating is performed at 1200° C. or higher, the most primary heat dissipation factor among them is (1) radiation. In order to suppress (1) radiation, the plate material 109 having the high melting point and low emissivity or the coating 109 having the high melting point and low emissivity is installed on the opposite side to the surfaces of the upper electrode 102, the lower electrode 103, and the specimen stage 104 contacting plasma. (3) Heat dissipation from the upper feed line 110 and the shaft 107 is suppressed to be minimum by optimizing the cross-sectional areas and the lengths of the upper feed line 110 and the shaft 107 as described above.

(2) Heat-transfer under the gas atmosphere is suppressed by optimizing a heat-transfer distance of gas. Herein, the heat-transfer distance of gas is distances from the upper electrode 102, the lower electrode 103, and the specimen stage 104 which are at the high temperature up to a shield (protection quartz plate 123) which is at a low temperature or a wall of the heating treatment chamber 100 which is the low temperature. Since thermal conductivity of He gas is high under a He gas atmosphere around the atmospheric pressure, heat dissipation by heat-transfer of gas is comparatively increased. Therefore, in the embodiment, each of the distances from the upper electrode 102 and the specimen stage 104 up to the shield (protection quartz plate 123) or the wall of the heating treatment chamber 100 is ensured as 30 mm or longer. It is advantageous for suppressing heat dissipation that the heat-transfer distance of gas is large, but when the heat-transfer distance of gas is excessively large, the size of the heating treatment chamber 100 with respect to the heating area is undesirably increased. By setting the heat-transfer distance of gas to 30 mm or longer, it is possible to suppress dissipation by heat-transfer under the gas atmosphere while suppressing the size of the heating treatment chamber 100. By using Ar, Xe, Kr gas, and the like having low thermal conductivity, heat dissipation by heat-transfer under the gas atmosphere may also be suppressed.

In the embodiment, as the radio-frequency power supply 111 for generating plasma, radio-frequency power of 13.56 MHz is used, but the reason is that since 13.56 MHz is an industrial frequency, the power may be obtained at a low cost and since an electromagnetic wave leakage reference is also low, a device cost may be reduced. However, in principle, heating may be performed in the same principle at other frequencies. In particular, frequencies in the range of 1 to 100 MHz are appropriate. When the frequency is lower than 1 MHz, radio-frequency voltage at the time of supplying power required for heating is increased, abnormal discharge (unstable plasma or discharge at an area other than the space between the upper electrode and the lower electrode) is generated, and it is difficult to generate stable plasma. When the frequency is higher than 100 MHz, impedance at the gap 108 between the upper electrode 102 and the lower electrode 103 is low, and as a result, it is undesirably difficult to acquire voltage required for generating plasma.

Figure 4:
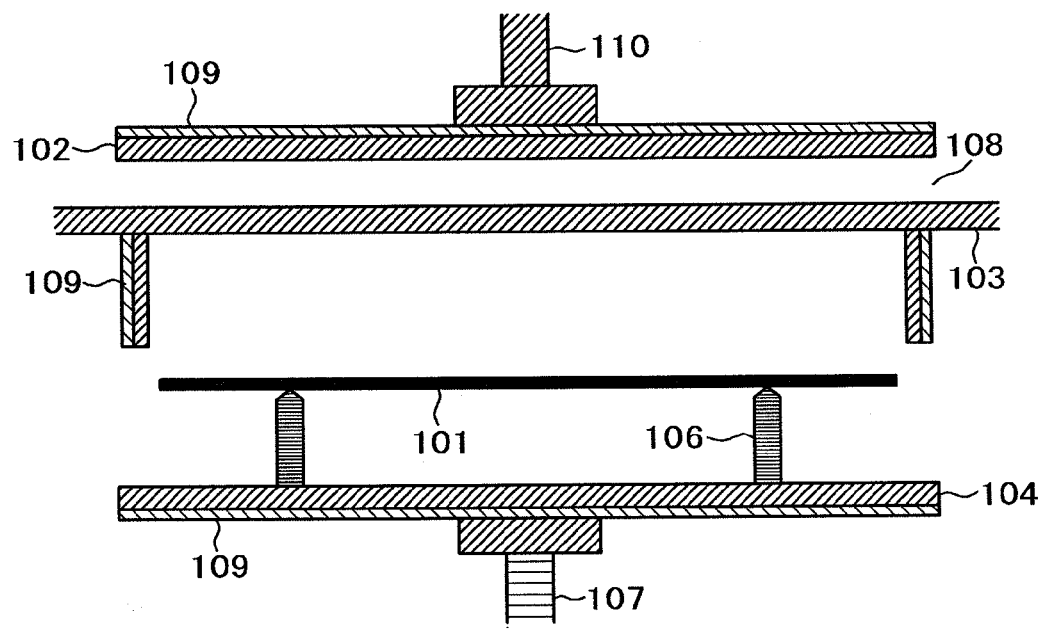
FIG. 4 is a diagram describing carry-in/out with respect to the heating treatment chamber of the heat treatment apparatus according to the first embodiment.

Subsequently, a method of carrying the specimen 101 in/from the heating treatment chamber 100 will be described with reference to FIGS. 3 and 4. FIGS. 3 and 4 are detailed diagrams of the heating area of the heating treatment chamber 100. FIG. 3 illustrates a state in which heating is in progress and FIG. 4 illustrates a state in which the specimen 101 is carried in and out.

In the case of carrying out the heated specimen 101 supported on the support pin 106 of the specimen stage 104, the plasma 124 is stopped from the heating state of FIG. 3 and the specimen stage 104 is moved down by the vertical mechanism 105, such that a gap is formed between the heated specimen 101 and the specimen stage 104 as illustrated in FIG. 4. A transportation arm (not illustrated) is horizontally inserted into the gap from the transportation port 117 and the vertical mechanism is moved down, such that the heated specimen 101 is guided to the transportation arm to be carried out. In the case of carrying the specimen 101 to be heated into the heating treatment chamber 100, the specimen 101 to be heated may be carried into the heating treatment chamber 100 by performing a reverse operation to carrying out the heated specimen.

While the support pin 106 of the specimen stage 104 is moved down in the vertical mechanism 105, the specimen 101 to be heated is transported from the transportation arm (not illustrated) mounted with the specimen 101 to be heated onto the support pin 106. Thereafter, the specimen stage 104 is moved up by the vertical mechanism 105 and the specimen stage 104 receives the specimen 101 to be heated from the transportation arm. The specimen stage 104 is moved up to a predetermined position for heating to make the specimen 101 to be heated come close to the lower part of the lower electrode 103 serving as the heating plate.

In the embodiment, since the upper electrode 102 and the lower electrode 103 are fixed, the gap 108 is not varied. As a result, stable plasma may be generated whenever the specimen 101 is heated.

As described above, the SiC substrate injected with ions is heated at 1500° C. for 1 minute by using the aforementioned heat treatment apparatus of the embodiment, and as a result, an excellent conductive characteristic may be acquired. Surface roughness does not appear on the surface of the SiC substrate.

Hereinafter, effects of the heat treatment apparatus described in the embodiment will be summarized. In the heating treatment according to the embodiment, the specimen 101 is heated by using gas heating by atmospheric pressure glow discharge generated at the narrow gap as a heat source. The following five effects which are not provided in the related art are acquired in association with the heating principle.

A first effect is thermal efficiency. The gas between the gaps 108 has a very small thermal capacity, and the plate material 109 having the high melting point and low emissivity or the coating 109 having the high melting point and low emissivity is placed in the upper electrode 102, the lower electrode 103, and the specimen stage 104, such that the specimen 101 may be heated under a system in which heating loss accompanied by radiation is very small.

A second effect is heating responsiveness and uniformity. Since a heat capacity of the heating unit (serving to directly heat the specimen to be heated) is very small, the temperature may be rapidly increased and decreased. Since the gas heating by the glow discharge is used as the heating source, uniform heating is planarly achieved by extension of the glow discharge. Nonuniformity of an in-plane device characteristic of the specimen 101 accompanied by the heating treatment may be suppressed by high temperature uniformity and damages caused by heat stress accompanied by an in-plane temperature difference of the specimen 101 when the temperature is rapidly increased may also be suppressed.

A third effect is reduction in consumed components accompanied by the heating treatment. In the embodiment, since gas contacting each of the upper electrode 102 and the lower electrode 103 is directly heated, a high-temperature area is limited to a member placed very adjacent to the upper electrode 102 and the lower electrode 103 and the temperature thereof is also equal to that of the specimen 101. Accordingly, the life-span of the member is long and an area of replacement accompanied by deterioration in components is also small.

A fourth effect is suppression of surface roughness of the specimen 101. In the embodiment, since it is possible to requisitely minimally shorten a time period during which the specimen 101 is exposed to a high-temperature environment in that the temperature rising time and the temperature dropping time may be shortened by the aforementioned effect, the surface roughness may be suppressed. In the embodiment, plasma by the atmospheric pressure glow discharge is used as the heating source, but the specimen 101 is not exposed directly to plasma. As a result, a process of forming and removing a protection film, which is performed by an apparatus other than the heat treatment apparatus, becomes unnecessary and a manufacturing cost of a semiconductor device using the SiC substrate may be reduced.

A fifth effect is simplification of carrying the specimen 101 in/out with respect to the heating treatment chamber 100. In the embodiment, the specimen 101 may be transferred to the specimen stage 104 from the transportation arm (not illustrated) or the specimen 101 may be transferred to the transportation arm (not illustrated) from the specimen stage 104, only by operating the vertical mechanism of the specimen stage 104. Since a complicated mechanism for performing the transfer is not required, the number of constituent components in the heating treatment chamber 100 may be reduced, and as a result, a simple configuration of the apparatus may be achieved.

Subsequently, a heat treatment apparatus in which a preliminary heating chamber 200 is additionally placed to the heat treatment apparatus of the embodiment will be described.

Second Embodiment

Figure 5:
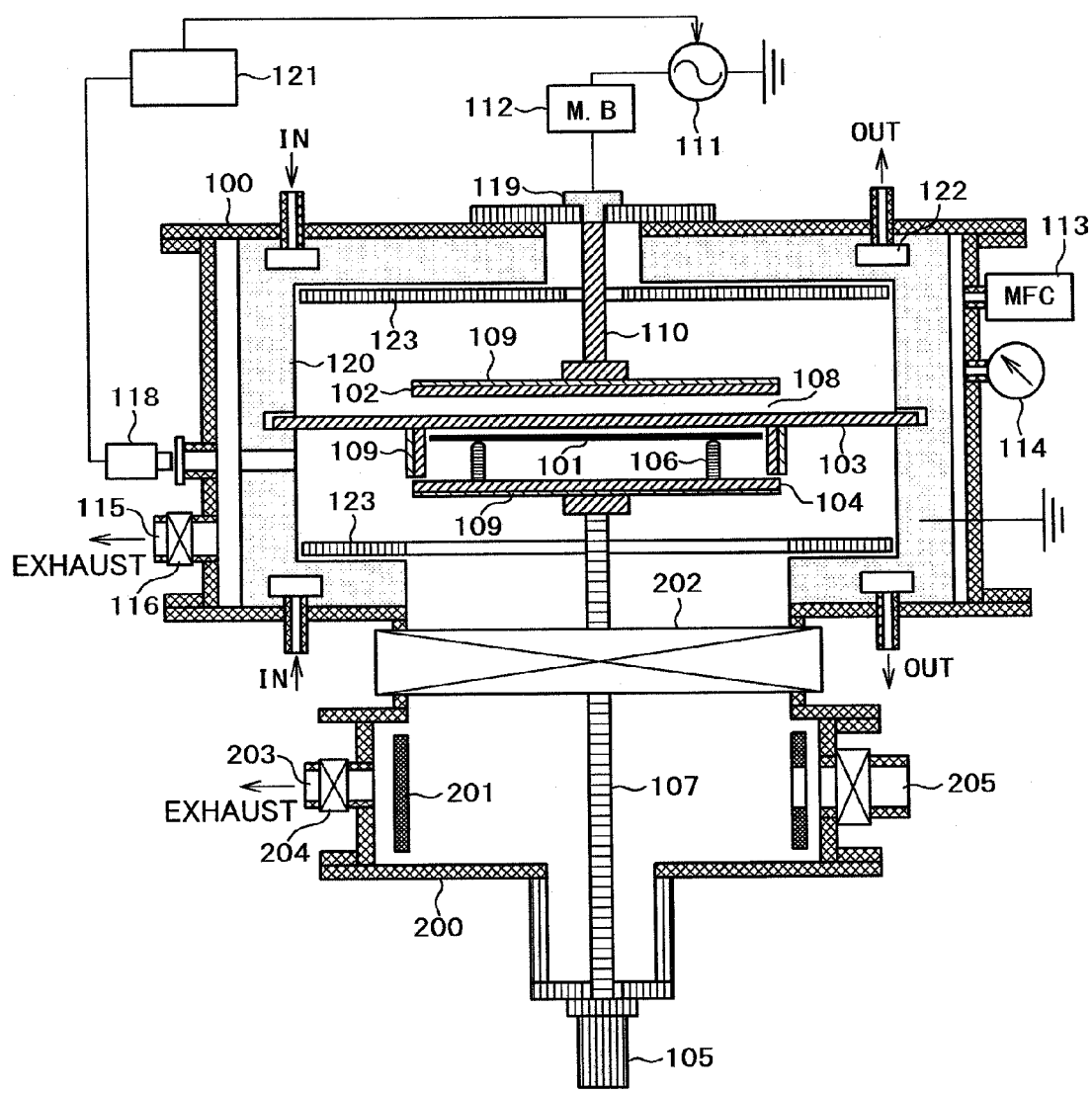
FIG. 5 is a basic configuration diagram of a heat treatment apparatus according to a second embodiment.

FIG. 5 is a diagram illustrating a basic configuration in which the preliminary heating chamber 200 is additionally placed to the heat treatment apparatus of the first embodiment.

The same reference numerals as those of the first embodiment refer to components serving to perform the same functions. Therefore, a description thereof will be omitted.

In the heat treatment apparatus of the embodiment, the preliminary heating chamber 200 is connected to the lower part of the heating treatment chamber 100 through a gate valve 202. Each of the heating treatment chamber 100 and the preliminary heating chamber 200 is airtightly closed by closing the gate valve 202. The heating treatment chamber 100 and the preliminary heating chamber 200 are in communication with each other by opening the gate valve 202.

The heat of the preliminary heating chamber 200 is exhausted by a vacuum pump (not illustrated) connected to an exhaust port 203 and a vacuum valve 204.

The specimen 101 to be heated is carried into the preliminary heating chamber 200 from the transportation port 205 and the specimen 101 to be heated is transferred onto the support pin 106 of the specimen stage 104 from the transportation arm (not illustrated), by the same method as the carrying-in/out method described in the first embodiment.

The specimen 101 to be heated supported on the support pin is heated up to a desired temperature by a heater 201. In the embodiment, the specimen 101 is heated up to 400° C. Subsequently, the gate valve 202 is opened, the vertical mechanism 105 is moved up, and the specimen 101 heated up to the desired temperature is carried into the heating treatment chamber 100 and heated.

By the embodiment, the same effect as in the first embodiment may be acquired and further, a heating treatment time in the heating treatment chamber 100 may be shortened, and as a result, the life-span of the consumed member in the heating treatment chamber 100 may be improved.

Subsequently, an embodiment of the present invention will be described below, which uses an upper electrode 303 serving as the heating plate and a lower electrode 302 to which radio-frequency power for generating plasma is supplied, instead of the upper electrode 102 and the lower electrode 103 described in the first embodiment, respectively.

Third Embodiment

A basic configuration of a heat treatment apparatus according to a third embodiment will be described with reference to FIG. 6.

The heat treatment apparatus of the embodiment includes a heating treatment chamber 300 that heats a specimen 301 to be heated by using plasma.

The heating treatment chamber 300 includes an upper electrode 303 serving as the heating plate, which is mounted with the specimen 301 to be heated on the top thereof, a lower electrode 302 opposed to the upper electrode 303, a reflection mirror (a first radiant heat suppressing member) 308 reflecting radiant heat, a radio-frequency power supply 311 supplying radio-frequency power for generating plasma to the lower electrode 302, a gas introduction means 313 supplying gas into the heating treatment chamber 300, and a vacuum valve 316 adjusting pressure in the heating treatment chamber 300.

In the embodiment, as the specimen 301 to be heated, a 4 inch (φ100 mm) SiC substrate is used.

The diameter and the thicknesses of the lower electrodes 302 are set to 120 mm and 5 mm, respectively. The lower electrode 302 and the upper electrode 303 are formed by depositing SiC (that is, the same material as the specimen 301 to be heated) on the surface of the graphite base by using the CVD method. A gap 304 between the lower electrode 302 and the upper electrode 303 is set to 0.8 mm.

Meanwhile, the diameter of the upper electrode 303 is equal to or larger than the inner diameter of the reflection mirror 308 and the thickness thereof is set to 2 mm, and further, the upper electrode 303 is mounted with the specimen 301 to be heated on the top thereof and heat of the upper electrode 303 heated by plasma generated between the upper electrode 303 and the lower electrode 302 is transferred to the specimen to be heated. That is, the upper electrode 303 also serves as the heating plate for the specimen 301 to be heated.

Figure 7:
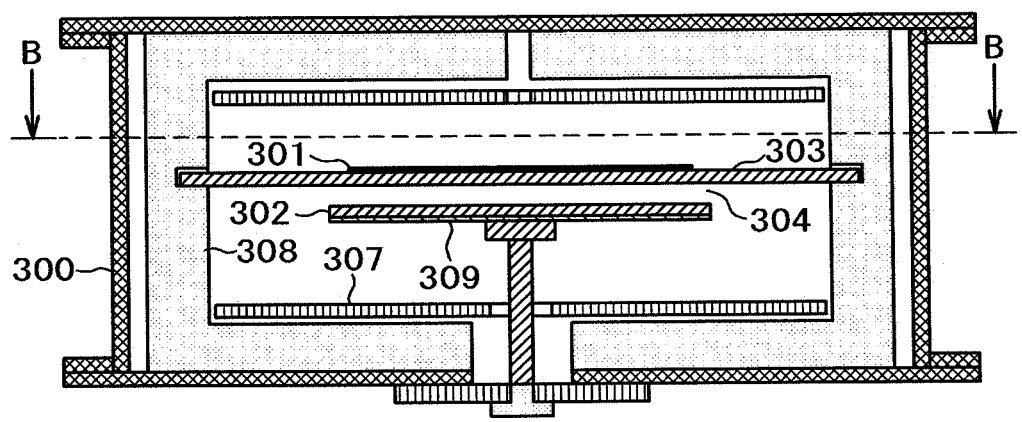
Figure 7A:
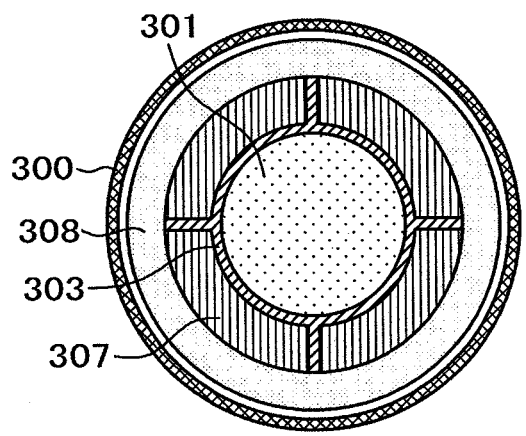
FIG. 7A is one example of a top view viewed from section BB.
Figure 7B:
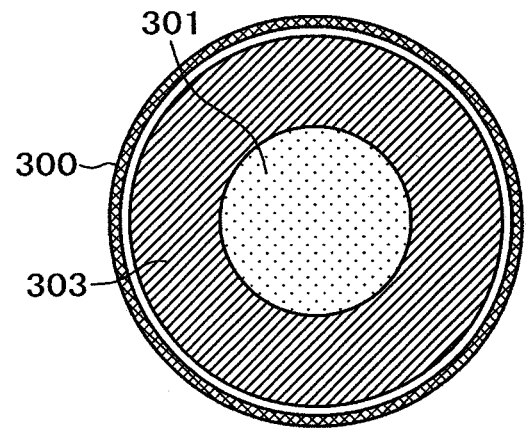
FIG. 7B is another example of the top view viewed from section BB.

A top view of section BB of a cross-sectional view of an apparatus illustrated in FIG. 7 is illustrated in FIGS. 7A and 7B. The upper electrode 303 is constituted by a disk-shaped member having substantially the same diameter as the lower electrode 302 and four beams placed at regular intervals, which connect the disk-shaped member and the reflection mirror 308, as illustrated in FIG. 7A. The number, cross-sectional areas, and thicknesses of the beams may be determined in consideration of the strength of the upper electrode 303 and heat dissipation from the upper electrode 303 to the reflection mirror 308.

Since the upper electrode 303 of the embodiment has a structure illustrated in FIG. 7A, the heat of the upper electrode 303 heated by plasma may be suppressed from being transferred to the reflection mirror 308, and as a result, the upper electrode serves as the heating plate having high thermal efficiency. The plasma generated between the upper electrode 303 and the lower electrode 302 is dispersed from a space between the beams, but most of the plasma is dispersed to a vacuum valve 316 side from the space between the upper electrode 303 and the lower electrode 302, and as a result, the specimen 301 may not almost be exposed to the plasma.

In the embodiment, unlike the first embodiment, the specimen 301 is directly mounted on the upper electrode 303 without passing through the specimen support pin 106 and thus may be uniformly heated in the plane of the specimen 301 as compared with the case in which the specimen 301 is mounted on the specimen support pin 106.

When the upper electrode 303 has a structure of FIG. 7B, the heating treatment chamber 300 may be separated into a plasma generation chamber generating plasma and a heating chamber heating the specimen 301, and as a result, the specimen 301 is not exposed to plasma and gas for generating plasma may be charged in only the plasma generation chamber. As a result, consumption of gas may be saved as compared with the structure of the upper electrode 303 of the embodiment illustrated in FIG. 7A. However, as described above, the structure of the upper electrode 303 of the embodiment illustrated in FIG. 7A is more excellent than the structure of FIG. 7B in a function as the heating plate.

Radio-frequency power is supplied from the radio-frequency power supply 311 to the lower electrode 302 through a lower feed line 305. In the embodiment, as a frequency of the radio-frequency power supply 311, 13.56 MHz is used. The upper electrode 303 is in conduction with the reflection mirror 308 on the outer periphery thereof and the upper electrode 303 is grounded through the reflection mirror 308. The lower feed line 305 is also made of graphite which is a constituent material of the lower electrode 302 and the upper electrode 303.

Figure 6:
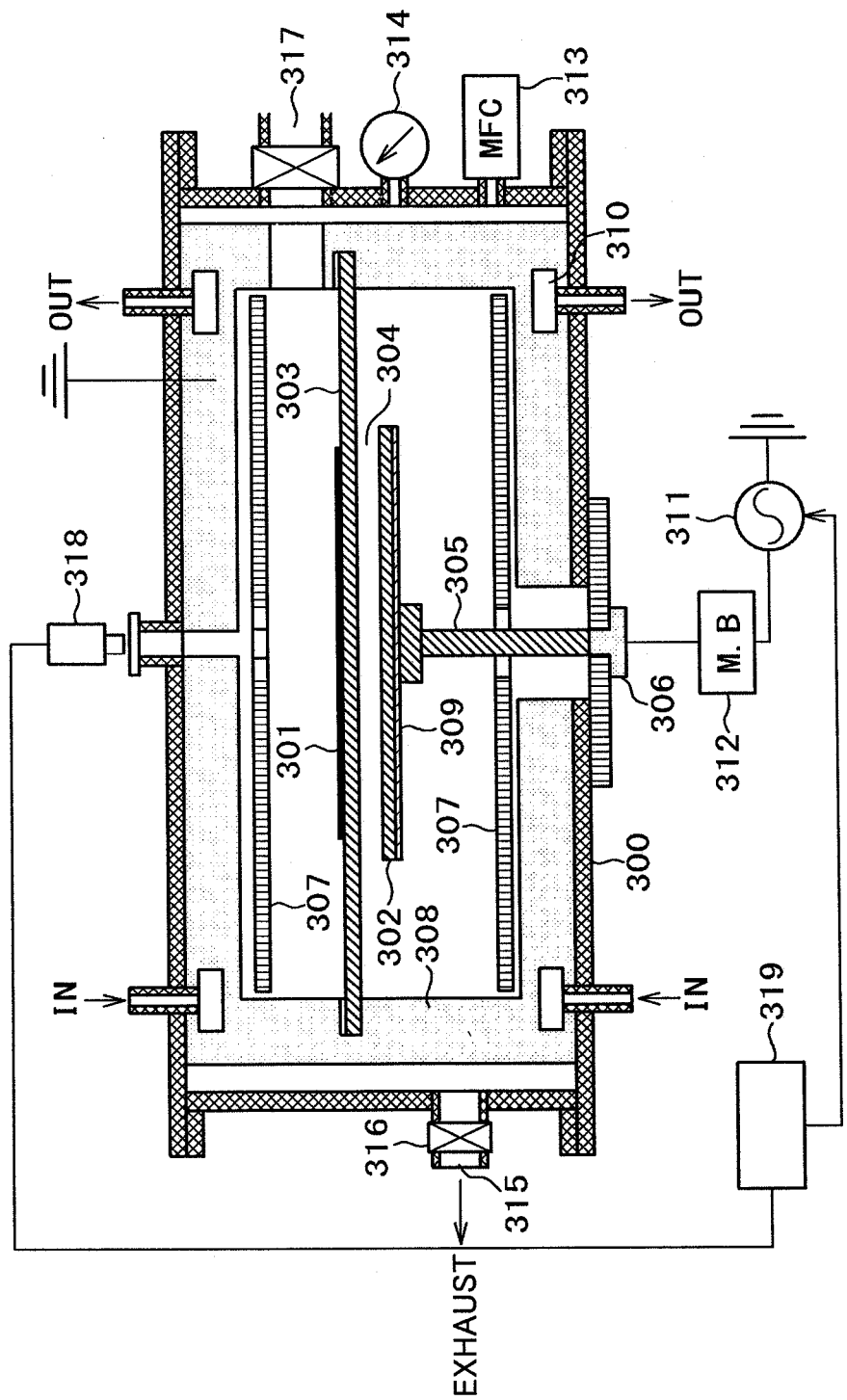
FIG. 6 is a basic configuration diagram of a heat treatment apparatus according to a third embodiment.

A matching circuit 312 (further, M.B of FIG. 6 is an abbreviation of Matching Box) is placed between the radio-frequency power supply 311 and the lower electrode 302 and the radio-frequency power from the radio-frequency power supply 311 is configured to be efficiently supplied to plasma formed between the lower electrode 302 and the upper electrode 303.

Gas is configured to be introduced into the heating treatment chamber 300 by the gas introduction means 313 in the range of 0.1 to 10 atmospheric pressure. The pressure of the gas introduced into the heating treatment chamber 300 is monitored by a pressure detection means 314. The heating treatment chamber 300 is exhausted by a vacuum pump (not illustrated) connected to an exhaust port 315 and a vacuum valve 316.

The lower electrode 302 and the upper electrode 303 in the heating treatment chamber 300 are configured to be surrounded by the reflection mirror 308. The reflection mirror 308 is configured by optically polishing an inner wall surface of a metallic base, and plating a polished surface with gold or depositing gold on the polished surface. A refrigerant path 310 is formed on the metallic base of the reflection mirror 308 and the temperature of the reflection mirror 308 is maintained constantly by making cooling water flow on the refrigerant path 122. Since radiant heat from the lower electrode 302 and the upper electrode 303 is reflected by providing the reflection mirror (first radiant heat suppressing member) 308, thermal efficiency may be increased, but the reflection mirror 308 is not a requisite component of the present invention.

A protection quartz plate 307 is placed between the lower electrode 302 and the upper electrode 303, and the reflection mirror 308. The protection quartz plate 307 serves to prevent contamination of the surface of the reflection mirror 308 by emissions (sublimation of graphite) from the upper electrode 303 and the lower electrode 302 which are at an ultra-high temperature and prevent contamination which may be mixed into the specimen 301 from the reflection mirror 308.

A plate material (a second radiant heat suppressing member) 309 having the high melting point and low emissivity or coating (a second radiant heat suppressing member) 309 having the high melting point and low emissivity is placed at an opposite side to the surface of the lower electrode 302 contacting plasma. Since the radiant heat from the lower electrode 302 may be reduced by providing the plate material 309 having the high melting point and low emissivity or the coating 309 having the high melting point and low emissivity, thermal efficiency may be increased. When a heating treatment temperature is low, the plate material 309 having the high melting point and low emissivity or the coating 309 having the high melting point and low emissivity need not be particularly provided. In the case of ultrahigh-temperature treatment, any one of the reflection mirror 308 and the plate material 309 having the high melting point and low emissivity or the coating 309 having the high melting point and low emissivity is provided or both are provided, such that the specimen may be heated at a predetermined temperature. The temperature of the specimen 301 is measured by a radiation thermometer 318. In the embodiment, as the plate material 309 having the high melting point and low emissivity or the coating 309 having the high melting point and low emissivity performed at an opposite side to the surface of the lower electrode 302 contacting plasma, a plate material in which the graphite base is coated with tantalum carbide (TaC) is used.

Subsequently, a basic operation example of the heat treatment apparatus of the embodiment will be described.

First, He gas in the heating treatment chamber 300 is exhausted from the exhaust port 315, such that the heating treatment chamber 300 is in a high vacuum state. When exhaustion is sufficiently terminated, the exhaust port 315 is closed, gas is introduced from the gas introduction means 313, and the pressure in the heating treatment chamber 300 is set to 0.6 atmospheric pressure. In the embodiment, as the gas introduced into the heating treatment chamber 300, He gas is used. The specimen 301 preliminarily heated at 400° C. in a spare chamber (not illustrated) is mounted on the upper electrode 303 as the heating plate from a transportation port 317 by using a transportation means (not illustrated).

After the specimen 301 to be heated is mounted on the upper electrode 303, the radio-frequency power from the radio-frequency power supply 311 is supplied to the lower electrode 302 through the matching circuit 312 and a power introduction terminal 306 and plasma is generated in the gap 304 to thereby heat the specimen 301. Energy of the radio-frequency power is absorbed in electrons in plasma and further, atoms or molecules of raw gas are heated by collision of the electrons. Ions generated by ionization are accelerated at an electric potential difference generated on a sheath of the surfaces of the lower electrode 302 and the upper electrode 303 contacting plasma and are incident in the lower electrode 302 and the upper electrode 303 while colliding with the raw gas. By the collision process, the temperature of gas charged between the upper electrode 303 and the lower electrode 302 or the temperatures of the surfaces of the lower electrode 302 and the upper electrode 303 may be increased.

In particular, around the atmospheric pressure in the embodiment, since the ions frequently collide with the raw gas at the time of passing through the sheath, it is considered that the raw gas charged between the upper electrode 303 and the lower electrode 302 may be efficiently heated. Herein, the pressure in the range of 0.1 to 1 atmospheric pressure is around the atmospheric pressure.

As a result, the raw gas may be easily heated up to approximately 1200 to 2000° C. The upper electrode 303 and the lower electrode 302 are heated by contacting the heated high-temperature gas. Some of neutral gas excited by collision of the electrons is deexcited in association with light emission, and the upper electrode 303 and the lower electrode 302 are heated even by light emission at this time. The specimen 301 is heated by radiation from the lower electrode 302 and the upper electrode 303 in which the high-temperature gas is mixed or which are heated, and heat-transfer from the upper electrode 303.

The specimen 301 to be heated is placed on the upper electrode 303, such that the upper electrode 303 is heated by the high-temperature gas and thereafter, the specimen 301 is heated, and thus, it is possible to obtain the effect of efficiently and uniformly heating the specimen 301.

The specimen 301 to be heated is placed at a portion of the upper electrode which does not contact plasma, such that an electric field having high uniformity may be formed between the lower electrode 302 and the upper electrode 303 and uniform plasma may be formed, regardless of the shape of the specimen 301. By placing the specimen 301 on the upper electrode 303, the specimen 301 is not exposed directly to the plasma formed in the gap 304. Even when arc discharge is performed from glow discharge, it is possible to avoid damage to the specimen 301 in that discharge current flows on the lower electrode 302 without passing through the specimen 301.

The temperature of the specimen 301 which is being heated is measured by the radiation thermometer 318 and the output of the radio-frequency power supply 311 is controlled so that the temperature of the specimen 301 is a predetermined temperature by a control unit 319 by using a measured value, and as a result, the heating temperature of the specimen 301 may be controlled with high precision. In the embodiment, the inputted radio-frequency power is maximally set to 20 kW.

In order to efficiently increase the temperatures of the lower electrode 302 and the upper electrode 303 (including the specimen 301), it is required to suppress heat-transfer of the lower feed line 305, heat-transfer through an He gas atmosphere, and radiation (visible-ray range from infrared rays) from a high-temperature range. In particular, in an ultrahigh temperature state at 1200° C. or higher, heat dissipation by radiation is very large and reduction in radiation loss is required to improve heating efficiency. In the case of the radiation loss, a radiation amount is increased in proportion to biquadrate of an absolute temperature.

In order to suppress the radiation loss, the plate material 309 having the high melting point and low emissivity or the coating 309 having the high melting point and low emissivity is placed at an opposite side to the surface of the lower electrode 302, which contacts plasma, as described in the embodiment. As the material having the high melting point and low emissivity, TaC is used. The emissivity of TaC is in the range of approximately 0.05 to 0.1 and infrared rays accompanied with radiation are reflected at reflectivity of approximately 90%. As a result, the radiation loss from the lower electrode 302 is suppressed and the specimen 301 may be in the ultrahigh temperature in the range of 1200 to 2000° C. with high thermal efficiency.

TaC is placed while not being exposed directly to plasma and impurities included in Ta or TaC are configured not to be mixed into the specimen 301 during heating. An increase in a heat capacity of a heated portion may be minimized in that a heat capacity of TaC which is the plate material 309 having the high melting point and low emissivity or the coating 309 having the high melting point and low emissivity is very small. Therefore, the speeds at which the temperature rises and drops are not almost decreased by placing the plate material 309 having the high melting point and low emissivity or the coating 309 having the high melting point and low emissivity.

The plasma generated between the upper electrode 303 and the lower electrode 302 is converted to plasma in the glow discharge range to generate plasma uniformly dispersed between the lower electrode 302 and the upper electrode 303, and the specimen 301 is heated by using the planar plasma as the heat source to uniformly heat the planar specimen 301.

Although the temperature of the specimen 301 to be heated is rapidly increased in that the specimen 301 may be heated planarly and uniformly, a risk which occurs due to a breakage accompanied by temperature nonuniformity in the heated specimen 301 is low. As a result, the temperature may be rapidly increased and decreased and a time required for a series of heating treatments may be shortened. By the effect, a throughput of the heating treatment may be improved, and presence time of the specimen 301 under a high-temperature atmosphere beyond necessity may be shortened and SiC surface roughness accompanied by a high temperature may be reduced.

After the heating treatment is terminated, the temperature of the heated specimen 301 is decreased until the temperature of the specimen 301 becomes 800° C. or lower, the specimen 301 is carried out from the transportation port 317, the subsequent specimen 301 to be heated is loaded on the upper electrode 303 by the transportation means (not illustrated), and a series of heating operations are repeated.

When the specimen 301 is replaced, a gas atmosphere at a specimen evacuation position (not illustrated) connected to the transportation port 317 is maintained at the same level as that in the heating treatment chamber 300, such that replacement of He gas in the heating treatment chamber 300 accompanied by replacement of the specimen 301 need not be performed, thereby reducing the amount of He gas used. Of course, since purity of He gas in the heating treatment chamber 300 may be decreased by repeating the heating treatment to some extent, He gas is regularly replaced at that time.

When He gas is used as gas for generating plasma, He gas is relatively high-priced gas, and as a result, the amount of He gas used is maximally reduced, thereby suppressing a running cost of the heat treatment apparatus. This may be applied to even the amount of He gas introduced during heating, and the amount of He gas is set to a minimum flow required to maintain the purity of He gas which is being heated, thereby reducing the amount of He gas used.

A cooling time of the heated specimen 301 may be shortened by introducing He gas. That is, after the heating treatment is terminated (after plasma stops), the amount of He gas is increased to thereby shorten the cooling time by a cooling effect of He gas.

In the embodiment, the specimen 301 is carried out under 800° C. or lower, but a transportation arm having high heat resistance is used, such that the specimen 301 may be carried out even under 800 to 2000° C. and a standby time may be shortened.

In the basic operation of the heat treatment apparatus of the embodiment, the gap 304 is set to 0.8 mm, but the same effect may be achieved even in the range of 0.1 to 2 mm. Even in the case of a gap which is narrower than 0.1 mm, plasma may be generated, but a high-precision configuration is required to maintain parallelism between the lower electrode 302 and the upper electrode 303 and further, alteration (roughness, and the like) of the surfaces of the lower electrode 302 and the upper electrode 303 influences plasma, which is not desirable. Meanwhile, in the case where the gap 304 is more than 2 mm, ignition performance of plasma deteriorates or radiation loss from a space between the gaps is increased, which is not desirable.

In the basic operation of the heat treatment apparatus of the embodiment, the pressure for forming plasma is set to 0.6 atmospheric pressure, but the pressure may be in the range of 10 atmospheric pressure or lower. When the pressure is higher than 10 atmospheric pressure, it is difficult to generate uniform glow discharge.

In the basic operation of the heat treatment apparatus of the embodiment, as the raw gas for generating plasma, He gas is used, but the same effect may be achieved even by using gas using inert gas such as Ar gas, Xe gas, Kr gas, or the like as the raw material. He gas used in the embodiment is excellent in plasma ignition performance or stability around the atmospheric pressure, but is high in thermal conductivity of gas and comparatively large in heat loss by the heat-transfer through the gas atmosphere. Meanwhile, gas having large mass such as Ar gas, Xe gas, Kr gas, or the like is low in thermal conductivity and thus is advantageous than He gas in terms of thermal efficiency.

In the embodiment, as the plate material 309 having the high melting point and low emissivity or the coating 309 having the high melting point and low emissivity performed in at the opposite side to the surface of the lower electrode 302 contacting plasma, the plate material in which the graphite base is coated with tantalum carbide (TaC) is used, but tungsten carbide (WC), molybdenum carbide (MoC), tantalum (Ta), molybdenum (Mo), and tungsten (W) may be used in addition thereto.

In the embodiment, graphite is used, in which the opposite side to the surface of the lower electrode 302 contacting plasma is coated with silicon carbide by the CVD method, but the same effect is achieved even by using single graphite, a member in which graphite is coated with pyrolytic carbon, a member in which the surface of graphite is vitrificated, and SiC (a sintered body, polycrystal, and single crystal). Graphite serving as the base of the lower electrode 302 or coating performed on the surface thereof desirably has high purity in terms of preventing contamination in the specimen 301.

At the ultrahigh temperature, contamination from the lower feed line 305 may also influence the specimen 301. As a result, in the embodiment, as the lower feed line 305, the same graphite as in the lower electrode 302 is also used. Heat of the lower electrode 302 is transferred to the lower feed line 305 and thereafter, lost. Accordingly, heat-transfer from the lower feed line 305 needs to be requisitely minimized.

As a result, the cross-sectional area of the lower feed line 305 formed by graphite may be small and the length thereof needs to be increased, as possible. However, when the cross-sectional area of the lower feed line 305 is very small and the length thereof is excessively large, radio-frequency power loss is increased in the lower feed line 305 and heating efficiency of the specimen 301 to be heated deteriorates. Therefore, in the embodiment, the cross-sectional area and the length of the lower feed line 305 formed by graphite are set to 12 mm$^2$ and 40 mm, respectively, but the cross-sectional area and the length of the lower feed line 305 may be in the range of 5 to 30 mm$^2$ and 30 to 100 mm, respectively.

In the embodiment, the radiation loss from the lower electrode 302 may be reduced by the plate material 309 having the high melting point and low emissivity or the coating 309 having the high melting point and low emissivity and radiant light is returned to the upper electrode 303 and the lower electrode 302 by the reflection mirror 308 to thereby improve heating efficiency, but the improvement of the heating efficiency may be expected even when only the plate material 309 having the high melting point and low emissivity or the coating 309 having the high melting point and low emissivity is installed. Similarly, even when only the reflection mirror 308 is placed, the improvement of the heating efficiency may be expected. Since the protection quartz plate 307 is placed to expect the effect of contamination prevention, sufficient heating efficiency may be acquired without using the protection quartz plate 307.

In the embodiment, heat dissipation from the lower electrode 302 and the upper electrode 303 that influences heating efficiency primarily includes (1) radiation, (2) heat-transfer under the gas atmosphere, and (3) heat-transfer from the lower feed line 305, as described above. When heating is performed at 1200° C. or higher, the most primary heat dissipation factor among them is (1) radiation.

In order to suppress (1) radiation, the plate material 309 having the high melting point and low emissivity or the coating 309 having the high melting point and low emissivity is installed on the opposite side to the surfaces of the lower electrode 302 contacting plasma. (3) Heat dissipation from the lower feed line 305 is suppressed to be minimum by optimizing the aforementioned cross-sectional area and the length.

(2) Heat-transfer under the gas atmosphere is suppressed by optimizing a heat-transfer distance of gas. Herein, the heat-transfer distance of gas is a distance from the lower electrode 302 and the upper electrode 303 which are at the high temperature up to the protection quartz plate 307 which is at the low temperature or the wall of the heating treatment chamber 300 which is at the low temperature.

Since thermal conductivity of He gas is high under a He gas atmosphere around the atmospheric pressure, heat dissipation by heat-transfer of gas is comparatively increased. As a result, in the embodiment, the distance from the lower electrode 302 to the protection quartz plate 307 or from the lower electrode to the reflection mirror 308 is ensured to be 30 mm or more. It is advantageous for suppressing heat dissipation that the heat-transfer distance of gas is large, but the size of the reflection mirror 308 with respect to the heating area is undesirably increased. By setting the heat-transfer distance of gas to 30 mm or longer, it is also possible to suppress heat dissipation by heat-transfer under the gas atmosphere while suppressing the size of the heating treatment chamber 300. Of course, by using Ar gas, Xe gas, Kr gas, and the like having low thermal conductivity, heat dissipation by heat-transfer under the gas atmosphere may further be suppressed.

In the embodiment, radio-frequency power of 13.56 MHz is used to generate plasma, but the reason is that since 13.56 MHz is the industrial frequency, the power may be obtained at the low cost and since the electromagnetic wave leakage reference is also low, a cost for the heat treatment apparatus may be reduced. However, in principle, plasma may be heated in the same principle at other frequencies. In particular, frequencies in the range of 1 MHz to 100 MHz are appropriate.

In the case of a frequency lower than 1 MHz, radio-frequency voltage is increased when radio-frequency power required for heating is supplied, abnormal discharge (unstable discharge or discharge in a portion other than a space between the upper electrode 303 and the lower electrode 302) occurs, and a stable operation becomes difficult, which is not appropriate. In the case of a frequency higher than 100 MHz, impedance at the gap 304 between the lower electrode 302 and the upper electrode 303 is low, and as a result, it is undesirably difficult to acquire voltage required for generating plasma.

In the embodiment, the lower electrode 302 and the upper electrode 303 are fixed, and the gap 304 is not varied. As a result, stable plasma may be generated whenever the specimen 301 is heated.

The SiC substrate injected with ions is heated at 1500° C. for 1 minute by using the heating treatment apparatus of the embodiment, and as a result, an excellent conductive characteristic may be acquired. Surface roughness does not appear on the surface of the SiC substrate.

Hereinafter, effects of the embodiment will be summarized. In the heating treatment according to the embodiment, the specimen 301 is heated by using gas heating by atmospheric pressure glow discharge generated at the narrow gap as a heat source. The following four effects which are not provided in the related art may be acquired in association with the heating principle.

A first effect is thermal efficiency. The gas between the gaps 304 has a very small thermal capacity, and the plate material 309 having the high melting point and low emissivity or the coating 309 having the high melting point and low emissivity is placed in the lower electrode 302, such that the specimen 301 may be heated under a system in which heating loss accompanied by radiation is very small.

A second effect is heating responsiveness and uniformity. Since the heat capacity of the heating unit is very small, the temperature may be rapidly increased and decreased. Since the gas heating by the glow discharge is used as the heating source, uniform heating is planarly achieved by extension of the glow discharge. Nonuniformity of an in-plane device characteristic of the specimen 301 accompanied by the heating treatment may be suppressed by high temperature uniformity and damages caused by heat stress accompanied by an in-plane temperature difference of the specimen 301 when the temperature is rapidly increased may also be suppressed.

A third effect is reduction in consumed components accompanied by the heating treatment. In the embodiment, since gas contacting each of the upper electrode 303 and the lower electrode 302 is directly heated, a high-temperature area is limited to a member placed very adjacent to the upper electrode 303 and the lower electrode 302 and the temperature thereof is also equal to that of the specimen 301. Accordingly, the life-span of the member is long and an area of replacement accompanied by deterioration in components is also small.

A fourth effect is suppression of surface roughness of the specimen 301. In the embodiment, since it is possible to requisitely minimally shorten a time period during which the specimen 301 is exposed to a high-temperature environment in that the temperature rising time and the temperature dropping time may be shortened by the aforementioned effect, the surface roughness may be suppressed. In the embodiment, plasma by the atmospheric pressure glow discharge is used as the heating source, but the specimen 301 is not exposed directly to plasma. As a result, a process of forming and removing a protection film, which is performed by an apparatus other than the heat treatment apparatus, becomes unnecessary and a manufacturing cost of a semiconductor device using the SiC substrate may be reduced.

Fourth Embodiment

A heat treatment apparatus according to a fourth embodiment will be described with reference to FIGS. 8 to 12. Matters not described in the embodiment and described in any one of the first to third embodiments may be applied to even the embodiment unless the circumstances are exceptional. As described in the embodiment, the heat treatment apparatus may be provided, which is high in thermal efficiency and may reduce surface roughness of a treated substrate even in the case of heating the specimen to 1200° C. or higher by indirectly heating the specimen with plasma. In the embodiment, a heat treatment apparatus which is further excellent in long-term stability will be described.

A factor that damages the long-term stability will be first described. In the embodiment, opposed carbon electrodes (the upper electrode and the lower electrode) are covered with a radiant reflection mirror having high reflectivity in order to acquire high thermal efficiency. As an atmosphere for forming discharge, a He atmosphere having high purity is used, but a carbon electrode which is a material for the upper electrode and the lower electrode contains hydrogen, oxygen, or moisture therein and the gases is discharged from the electrode during initial heating. When the gas is discharged, the gas is discharged in the forms of hydrocarbon, carbon monoxide, and hydrogen and the discharged gases are repeatedly separated or combined in the plasma, such that foreign matter having a soot-like may be formed. When the soot-like foreign matter is attached to the radiant reflection mirror, the plate material having the high melting point and low emissivity, or the coating having the high melting point and low emissivity, reflectivity may deteriorate and the heating efficiency may deteriorate. The plate material having the high melting point and low emissivity, or the coating having the high melting point and low emissivity partially contacts the upper electrode or the lower electrode and thus has substantially the same temperature as the electrodes. When the material for the plate material having the high melting point and low emissivity, or the coating having the high melting point and low emissivity is exposed to the high temperature over a long time, the material itself is thermally altered, which may cause prolonged deterioration in reflectivity. The material for the plate material having the high melting point and low emissivity or the coating having the high melting point and low emissivity generally includes impurities. When the material is exposed to the high temperature over a long time, the impurities are discharged and the specimen to be heated may be contaminated. Therefore, in the embodiment, a configuration for suppressing or preventing the factor will be described.

The basic configuration in the heat treatment apparatus according to the embodiment will be described with reference to FIG. 8.

The heat treatment apparatus of the embodiment includes the heating treatment chamber 100 that indirectly heats the specimen 101 to be heated through the lower electrode 103 by using the plasma 124.

The heating treatment chamber 100 includes an upper electrode 102, a lower electrode 103 opposed to the upper electrode 102 and serving as a heating plate, a specimen stage 104 having a support pin 106 supporting the specimen 101 to be heated, a reflection mirror (a first radiant heat suppressing member) 120 reflecting radiant heat, a radio-frequency power supply 111 supplying radio-frequency power for generating plasma to the upper electrode 102, a gas introduction means 113 supplying gas into the heating treatment chamber 100, and a vacuum valve 116 adjusting pressure in the heating treatment chamber 100. The power from the radio-frequency power supply may be supplied to the lower electrode serving as the heating plate together with the upper electrode or instead of the upper electrode.

The specimen 101 to be heated is supported on the support pin 106 of the specimen stage 104 and placed close to a lower part of the lower electrode 103. The lower electrode 103 is held by the reflection mirror 120 and does not contact the specimen 101 to be heated and the specimen stage 104. In the embodiment, as the specimen 101 to be heated, a 4 inch (φ100 mm) SiC substrate is used. The diameters and thicknesses of the upper electrodes 102 and the specimen stage 104 are set to 120 mm and 5 mm, respectively.

The upper electrode 102, the lower electrode 103, and the specimen stage 104 in the heating treatment chamber 100 are configured to be surrounded by the reflection mirror 120. The reflection mirror 120 is configured by optically polishing an inner wall surface of a metallic base, and plating a polished surface with gold or depositing gold on the polished surface. A refrigerant path 122 is formed on the metallic base of the reflection mirror 120 and the temperature of the reflection mirror 120 is maintained constantly by making cooling water flow on the refrigerant path 122. The reflection mirror 120 is not a requisite component, but is provided, such that radiant heat from the upper electrode 102, the lower electrode 103, and the specimen stage 104 is reflected, thereby increasing thermal efficiency.

The protection quartz plate 123 is placed between the upper electrode 102 and the specimen stage 104, and the reflection mirror 120. The protection quartz plate 123 serves to prevent contamination of the surface of the reflection mirror 120 by emissions (sublimation of graphite) from the upper electrode 102, the lower electrode 103, and the specimen stage 104 which are at 1200° C. or higher and prevent contamination which may be mixed into the specimen 101 from the reflection mirror 120.

Figure 9:
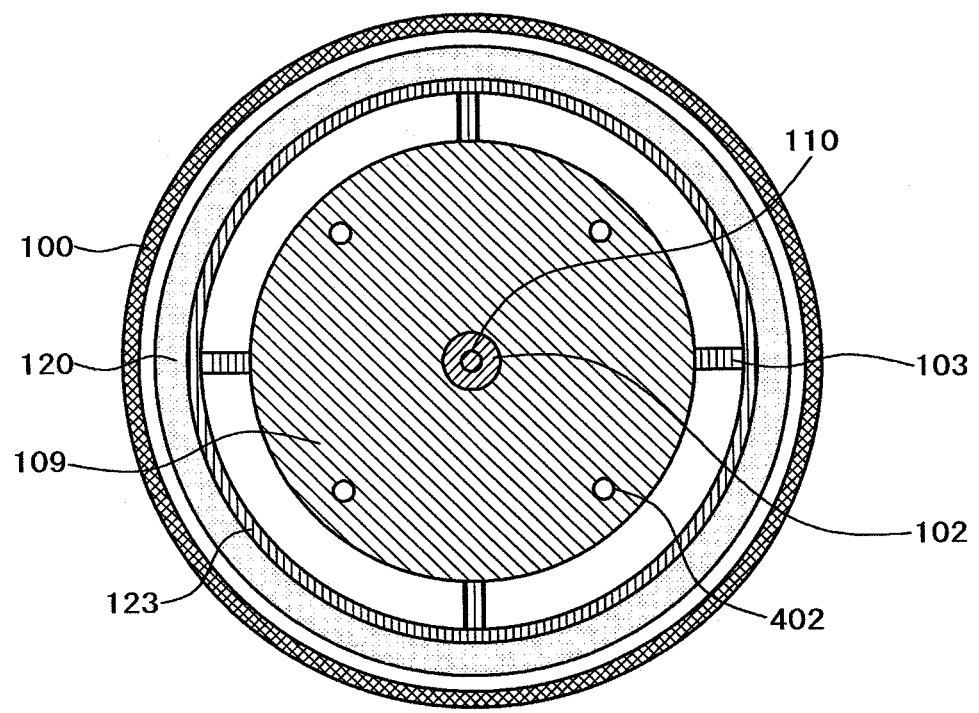
FIG. 9 is a top view viewed from section A in a heating treatment chamber of the heat treatment apparatus according to the fourth embodiment.
Figure 10:
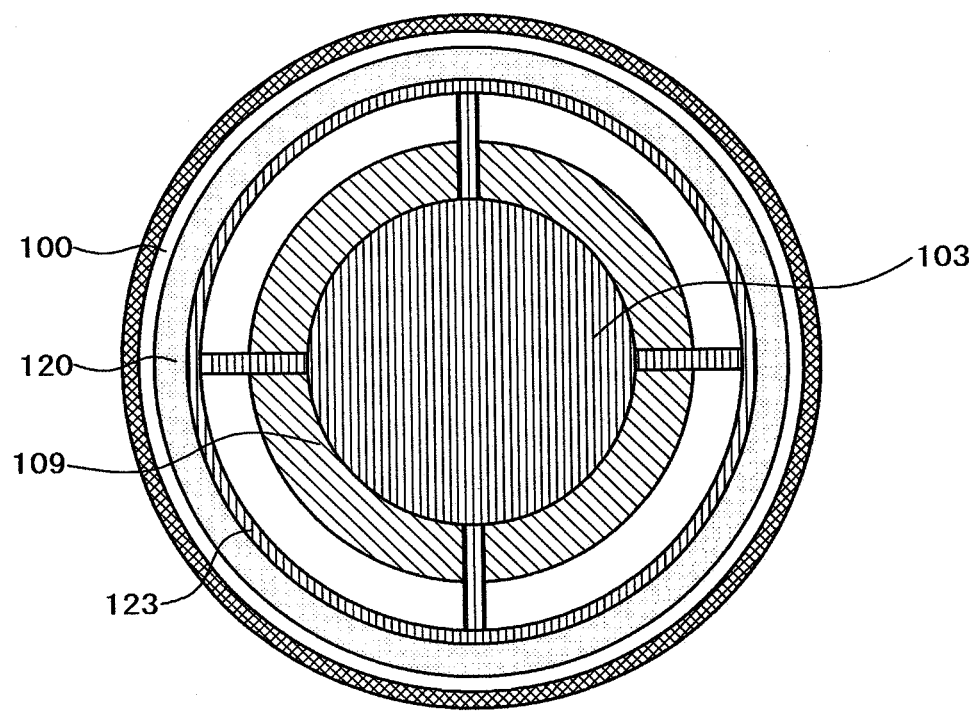
FIG. 10 is a top view viewed from section B in the heating treatment chamber of the heat treatment apparatus according to the fourth embodiment.

The diameter of the lower electrode 103 has the same as that of the upper electrode, front ends of the beams supporting the lower electrode 103 are configured to extend up to the inside of the reflection mirror 120, and the thickness including the beams is set to 2 mm. The lower electrode 103 has a member having an inner cylindrical shape to cover the side of the specimen 101 at an opposite side to a surface opposed to the upper electrode 102. Top views on sections A and B illustrated in FIG. 8 are illustrated in FIGS. 9 and 10, respectively. The lower electrode 103 is constituted by a disk-shaped member having substantially the same diameter as the upper electrode 102 and four beams placed at regular intervals, which connect the disk-shaped member and the reflection mirror 120, as illustrated in FIGS. 9 and 10. The number, cross-sectional areas, and thicknesses of the beams are determined bin consideration of the strength of the lower electrode 103 and heat dissipation from the lower electrode 103 to the reflection mirror 120.

A heat shield (a plate material having the high melting point and low emissivity or coating having the high melting point and low emissivity, a second radiant heat suppressing member) 109 is placed between the reflection mirror (the first radiant heat suppressing member) 120 and is placed so as to surround the upper electrode 102, the lower electrode 103, the specimen 101, and the specimen stage 104. The heat shield 109 is divided into an upper section and a lower section, and the upper heat shield 109 is fixed to the reflection mirror 120 by a fixation member 402 and the lower heat shield 109 is fixed to the specimen stage 104. The fixation member 402 fixing the upper heat shield as a thin bar-shaped member is made of quartz or ceramics. As a material for the fixation member 402, a material having low thermal conductivity as much as possible is selected, and the size of the fixation member 402 is set as a minimum size required to fix the heat shield 109, thereby suppressing heat-transfer loss from the heat shield 109 to the reflection mirror 120 to be low. In the embodiment, the heat shield 109 is formed by a tungsten foil having a thickness 0.1 mm. The heat shield 109 of the embodiment has an end side wall on the periphery thereof. The end wall is not requisite, but is installed to further improve thermal efficiency. The end wall may be formed by integral processing with a body of the heat shield, but may be processed separately from the body of the heat shield to be joined to the body of the heat shield. The heat shield 109 of the embodiment does not have a portion that directly contacts a member (the upper electrode 102 or the lower electrode 103) directly heated by plasma and separated from the electrodes, differently from the first embodiment. As a result, since a heating temperature of the heat shield may be decreased, emissivity by thermal deterioration may suppress prolonged deterioration, discharge of the impurities, or the like. Since the heat shield is placed to surround the upper electrode and the lower electrode which are at the high temperature, even though the soot-like foreign matter is generated due to the electrodes, the soot-like foreign matter may be suppressed and prevented from being mixed to the surface of the heat shield and the soot-like foreign matter may be suppressed and prevented from being attached to the surface of the heat shield or the surface of the reflection mirror. As a result, prolonged deterioration in emissivity of the heat shield or prolonged deterioration in reflectivity of the reflection mirror may be suppressed (a detailed description thereof will be made below).

Since the lower electrode 103 is (held) supported on the reflection mirror through the thin beams as illustrated in FIGS. 9 and 10, the heat of the lower electrode 103 heated by the plasma 124 may be suppressed from being transferred to the reflection mirror 120 and the lower electrode 103 serves as the heating plate having high thermal efficiency. The plasma 124 generated between the upper electrode 102 and the lower electrode 103 is diffused to the vacuum valve 116 side from a space between the beams, but since the specimen 101 is covered with the member having the inner cylindrical shape, the specimen 101 is not exposed to the plasma 124.

The upper electrode 102, the lower electrode 103, the specimen stage 104, and the support pin 106 are used, which is formed by depositing SiC on the surface of a graphite base by a chemical vapor deposition method (hereinafter, referred to as a CVD method).

A gap between the lower electrode 103 and the upper electrode 102 is set to 0.8 mm. The specimen 101 to be heated has a thickness in the range of approximately 0.5 mm to 0.8 mm and a circumferential angle of each of portions of the upper electrode 102 and the lower electrode 103 that are opposed to each other is processed in a tapered or round shape. This is to suppress localization of plasma by electric field concentration at the angle portion of each of the upper electrode 102 and the lower electrode 103.

The specimen stage 104 is connected with a vertical mechanism (an up-down mechanism) 105 through a shaft 107 and the specimen 101 may be transferred or the specimen 101 may come close to the lower electrode 103 by operating the vertical mechanism 105. A detailed description thereof will be made below. The shaft 107 is made of an alumina material.

Radio-frequency power is supplied from the radio-frequency power supply 111 to the upper electrode 102 through an upper feed line 110. In the embodiment, as a frequency of the radio-frequency power supply 111, 13.56 MHz is used. The lower electrode 103 is in conduction with the reflection mirror 120 through the beams. The lower electrode 103 is grounded through the reflection mirror 120. The upper feed line 110 is made of graphite which is a constituent material of the upper electrode 102 and the lower electrode 103.

Figure 8:
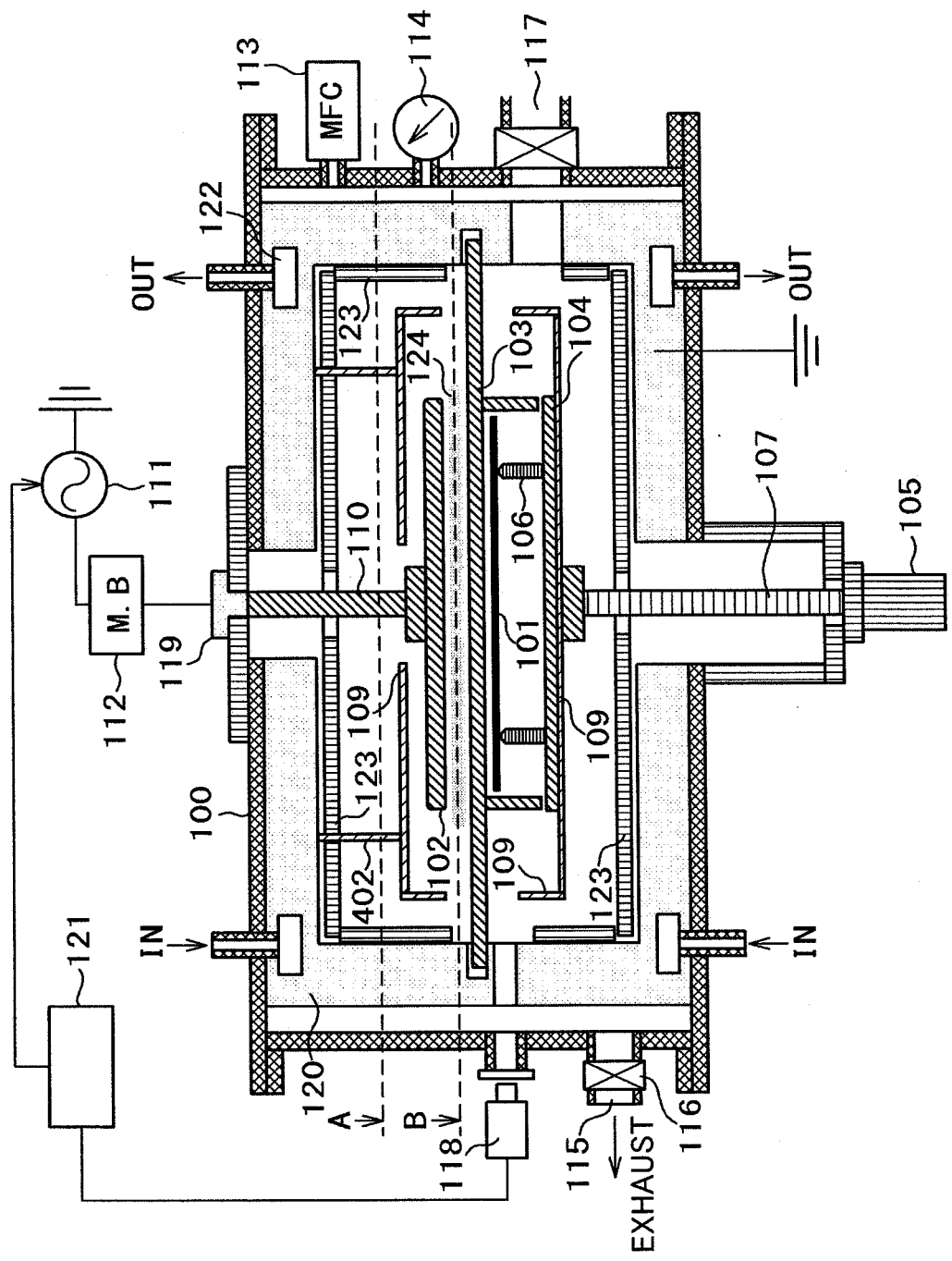
FIG. 8 is a basic configuration diagram of a heat treatment apparatus according to a fourth embodiment.

A matching circuit 112 (further, M.B of FIG. 8 is an abbreviation of Matching Box) is placed between the radio-frequency power supply 111 and the upper electrode 102 and the radio-frequency power from the radio-frequency power supply 111 is configured to be efficiently supplied to the plasma 124 formed between the upper electrode 102 and the lower electrode 103.

Gas is configured to be introduced into the heating treatment chamber 100 where the upper electrode 102 and the lower electrode 103 are placed by the gas introduction means 113 in the range of 0.1 to 10 atmospheric pressure. The pressure of the introduced gas is monitored by a pressure detection means 114. The heating treatment chamber 100 is configured such that gas is exhausted by a vacuum pump connected to an exhaust port 115 and the vacuum valve 116.

Subsequently, a basic operation example of the heat treatment apparatus of the embodiment will be described.

First, He gas in the heating treatment chamber 100 is exhausted from the exhaust port 115, such that the heating treatment chamber 100 is in a high vacuum state. When exhaustion is sufficiently terminated, the exhaust port 115 is closed and gas is introduced from the gas introduction means 113 to control the inside of the heating treatment chamber 100 at 0.6 atmospheric pressure. In the embodiment, as the gas introduced into the heating treatment chamber 100, He is used.

The specimen 101 preliminarily heated at 400° C. in a spare chamber (not illustrated) is transported from a transportation port 117 and supported on the support pin 106 of the specimen stage 104. A method of supporting the specimen 101 to be heated on the support pin 106 will be described in detail below.

After the specimen 101 to be heated is supported on the support pin 106 of the specimen stage 104, the specimen stage 104 is lifted up to a predetermined position by the vertical mechanism 105. In the embodiment, a position where a distance between the bottom of the lower electrode 103 and the surface of the specimen 101 to be heated is 0.5 mm is set as the predetermined position.

In the embodiment, the distance between the bottom of the lower electrode 103 and the surface of the specimen 101 to be heated is set to 0.5 mm, but the distance may be 0.1 to 2 mm. Heating efficiency is increased as the specimen 101 to be heated comes close to the bottom of the lower electrode 103, but as the specimen 101 to be heated comes close to the bottom of the lower electrode 103, a risk that the lower electrode 103 and the specimen 101 to be heated will contact each other is increased or a problem such as contamination, and the like occurs, and as a result, the distance is undesirably less than 0.1 mm. When the distance is more than 2 mm, the heating efficiency is decreased and radio-frequency power required for heating is increased, which is not desirable. As a result, closeness in the present embodiment represents the distance from 0.1 to 2 mm.

After the specimen stage 104 is elevated at a predetermined position, the radio-frequency power from the radio-frequency power supply 111 is supplied to the upper electrode 102 through the matching circuit 112 and the power introduction terminal 119 and plasma 124 is generated in the gap to thereby heat the specimen 101 to be heated. Energy of the radio-frequency power is absorbed in electrons in plasma and further, atoms or molecules of raw gas are heated by collision of the electrons. Ions generated by ionization are accelerated at an electric potential difference generated on a sheath of the surfaces of the upper electrode 102 and the lower electrode 103 contacting the plasma 124 and are incident in the upper electrode 102 and the lower electrode 103 while colliding with the raw gas. By the collision process, the temperature of gas charged between the upper electrode 102 and the lower electrode 103 or the temperatures of the surfaces of the upper electrode 102 and the lower electrode 103 may be increased.

In particular, around the atmospheric pressure as in the embodiment, since the ions frequently collide with the raw gas at the time of passing through the sheath, it is considered that the raw gas charged between the upper electrode 102 and the lower electrode 103 may be efficiently heated. Herein, the pressure in the range of 0.1 to 1 atmospheric pressure is around the atmospheric pressure.

As a result, the raw gas may be easily heated up to approximately 1200 to 2000° C. By contacting the heated high-temperature gas with the upper electrode 102 and the lower electrode 103, the upper electrode 102 and the lower electrode 103 are heated. Some of neutral gas excited by collision of the electrons is deexcited in association with light emission, and the upper electrode 102 and the lower electrode 103 are heated even by light emission at this time. The specimen stage 104 and the specimen 101 are heated by radiation from the upper electrode 102 and the lower electrode 103 in which the high-temperature gas is mixed or which are heated.

Herein, the lower electrode 103 serving as the heating plate comes close to an upper part of the specimen 101 to be heated, such that the lower electrode 103 is heated by gas heated by the plasma 124 at the high temperature and thereafter, the specimen 101 is heated, and as a result, it is possible to obtain the effect that the specimen 101 may be uniformly heated. The specimen stage 104 is installed below the lower electrode 103, such that a uniform electric field may be formed between the lower electrode 103 and the upper electrode 102 and the uniform plasma 124 may be generated, regardless of the shape of the specimen 101 to be heated. By placing the specimen 101 to be heated below the lower electrode 103, the specimen 101 to be heated is not exposed directly to the plasma 124 formed in the gap 108. Even when arc discharge is performed from glow discharge, it is possible to avoid damage to the specimen 101 in that discharge current flows on the lower electrode 103 without passing through the specimen 101.

When the upper electrode 102 and the lower electrode 103 are heated by the plasma 124, the soot-like foreign matter may be formed between the upper electrode 102 and the lower electrode 103 by sublimation of an electrode member. The soot-like foreign matter is transferred to an air stream of the heating treatment chamber 100 accompanied by heating and attached to the protection quartz plate 123 of the reflection mirror 120. When the soot-like foreign matter is attached to the protection quartz plate 123, effective reflectivity of the reflection mirror 120 deteriorates, heating efficiency of the upper electrode 102 and the lower electrode 103 deteriorates or a temporal change is caused, and stable and high-efficiency heating of the specimen 101 to be heated is inhibited. However, in the embodiment, the heat shield (the plate material having the high melting point and low emissivity or the coating having the high melting point and low emissivity) 109 is placed between the heating area (the upper electrode 102, the lower electrode 103, the specimen 101 to be heated, and the specimen stage 104), and the reflection mirror 120. As a result, even though the soot-like foreign matter is generated in the plasma 124, the corresponding soot-like foreign matter is attached to an inner surface (a surface facing to the upper electrode 102, the lower electrode 103, the specimen 101 to be heated, and the specimen stage 104) of the heat shield 109, thereby preventing the soot-like foreign matter from being attached to the surface of the reflection mirror 120 or an outer surface (a surface facing to the reflection mirror) of the heat shield 109. Since the heating efficiency of the heating area (the upper electrode 102, the lower electrode 103, the specimen 101 to be heated, and the specimen stage 104) is determined by emissivity of the surface of the reflection mirror 120 and the outer surface (the surface facing to the reflection mirror) of the heat shield, even if the soot-like foreign matter is attached to the inner surface (the surface facing to the upper electrode 102, the lower electrode 103, the specimen 101 to be heated, and the specimen stage 104) of the heat shield 109, the emissivity is not significantly changed. Accordingly, the thermal efficiency of the heating area may be stably maintained over a long time.

When the heat shield 109 is installed, an inner portion of the heating area including the heat shield 109 becomes the heating area. Therefore, the heat capacity of the heating unit also includes a heat capacity of the heat shield 109. However, as described in the embodiment, the heat shield 109 is formed by thin tungsten of approximately 0.1 mm, such that the heat capacity of the heat shield 109 may be very small and deterioration in temperature responsiveness accompanied by the increase in the heat capacity may be suppressed to be minimum. That is, the heat capacity of the heating treatment chamber 100 may be controlled by volume formed by the heat shield 109. As described above, the soot-like foreign matter is attached to the inner surface of the heat shield 109, such that even though the emissivity is changed, an influence exerted on heating efficiency of the entire heating area (the upper electrode 102, the lower electrode 103, the specimen 101 to be heated, and the specimen stage 104 placed inside the heat shield 109) including the heat shield 109 is small. Strictly, thermal responsiveness of the inside of the heat shield 109 is changed as large as the heat capacity of the heat shield 109, but the heat capacity of the heat shield 109 is very small with respect to the heat capacity of the entire heating area (the heat shield 109, the upper electrode 102, the lower electrode 103, the specimen 101 to be heated, and the specimen stage 104), and as a result, the influence thereof may be disregarded. However, the emissivity of the inner surface of the heat shield 109 is set to a high value from the first, such that the change by attachment of soot may be relatively small and a temporal change in heating responsiveness by attachment of the soot-like foreign matter may be smaller. In detail, the outer surface of the heat shield 109 is polished and the emissivity is lowered, but polishing, and the like are not performed with respect to the inner surface, such that the above effect may be achieved.

The temperature of the heat shield 109 becomes an intermediate temperature between the temperatures of the upper electrode 102 and the lower electrode 103 and the temperature of the protection quartz plate 123 of the cooled reflection mirror 120. In detail, when the upper electrode 102 and the lower electrode 103 are at 1800° C., the protection quartz plate 123 becomes approximately 100° C. in order to make close to the cooled reflection mirror and when the heat shield 109 is placed on the midway thereof, the temperature of the heat shield 109 becomes approximately 1000° C. which is an average of 1800° C. and 200° C. When the heat shield 109 comes close to the upper electrode 102 and the lower electrode 103, the temperature of the heat shield 109 makes close to the temperatures of the upper electrode 102 and the lower electrode 103 and on the contrary, when the temperature of the heat shield 109 comes close to the temperature of the protection quartz plate 123, the temperature of the heat shield 109 makes close to the protection quartz plate 123. In the first embodiment, when the temperatures of the upper electrode 102 and the lower electrode 103 are 1800° C., the heat shield 109 is placed at a position where the temperature of the heat shield 109 becomes at approximately 1400° C. The temperature of the heat shield 109 is maintained to be lower than the temperatures of the upper electrode 102 and the lower electrode 103 required for heating, such that alternation accompanied by the high temperature of the material of the heat shield 109 and the discharge of the contamination material may be prevented. When the heat shield 109 is maintained to approximately 1800° C. which is the treatment temperature, alteration accompanied by recrystallization of tungsten which is the material thereof or discharge of very small quantity of impurities included therein is caused. When the heat shield 109 is directly filled into the plasma 124, a risk of the discharge of the contamination material from the heat shield 109 or the alteration of the material also increases. Accordingly, the heat shield illustrated in FIG. 8 is configured to be placed between the reflection mirror 120, and the upper electrode 102 and the lower electrode 103 while being spaced apart from the upper electrode 102 and the lower electrode 103 by a predetermined distance, such that the change in emissivity of the heat shield 109 or the discharge of the contamination material may be suppressed.

When the emissivity of the outer surface (the surface opposed to the reflection mirror 120) of the heat shield 109 illustrated in the embodiment of FIG. 8 is set as $\epsilon_s$ and the emissivity of the reflection mirror 120 is set as $\epsilon_m$, radiation loss $T_{Loss}$ of the heating area (the heat shield 109, the upper electrode 102, the lower electrode 103, the specimen 101 to be heated, and the specimen stage 104) in the embodiment of FIG. 8 is expressed by Equation 1.

[Equation 1]

$$T_{Loss} \propto \frac{1}{\frac{1}{\epsilon_s} + \frac{1}{\epsilon_m} - 1} \qquad (1)$$

As seen in Equation 1, the radiation loss $T_{Loss}$ of the heating area decreases as both the emissivities $\epsilon_s$ and $\epsilon_m$ decrease and the thermal efficiency may increase. The emissivity $\epsilon_s$ of the reflection mirror 120 may be 0.1 or less by using a mirror surface made of gold (Au). Meanwhile, the heat shield needs to endure a predetermined extent of high temperature and further, maximally suppress contamination, and as a result, an option is limited in terms of a material. In the embodiment, the tungsten foil is used as the heat shield and at least the outer surface (the surface opposed to the reflection mirror 120) of the tungsten foil is used as a polishing surface, such that the emissivity $\epsilon_m$ may be in the range of 0.1 to 0.5. For example, the thermal loss of the heating area when only the reflection mirror 120 is used without using the heat shield (the plate material having the high melting point and low emissivity or the coating having the high melting point and low emissivity) 109 is loss suppression of approximately ⅑ (when the emissivity of the reflection mirror 120 is 0.1 and the emissivities of the upper electrode and the lower electrode are 1) when the reflection mirror is not used, but when the heat shield 109 is installed and the emissivity of the outer surface (the surface facing to the reflection mirror 120) of tungsten is completed as approximately 0.1, the radiation loss may be 1/19 and the thermal loss of the heating area may be reduced to approximately a half as compared with the case in which only the reflection mirror 120 is used, and heating efficiency may be improved.

In order to efficiently increase the temperatures of the upper electrode 102, the lower electrode 103, and the specimen stage 104 (including the specimen 101 to be heated), it is required to suppress heat-transfer of the upper feed line 110, heat-transfer through an He gas atmosphere, and radiation (visible-ray range from infrared rays) from a high-temperature range. In particular, in a high temperature state at 1200° C. or higher, an influence of heat dissipation by radiation is very large and reduction in radiation loss is required to improve heating efficiency. In the case of the radiation loss, a radiation amount is increased in proportion to biquadrate of an absolute temperature. Accordingly, by using the aforementioned reflection mirror 120 and heat shield 109, the thermal efficiency of the heating area may be significantly improved.

The temperature of the lower electrode 103 or the specimen stage 104 which is being heated is measured by the radiation thermometer 118 and the output of the radio-frequency power supply 111 is controlled so that the temperature of the lower electrode 103 or the specimen stage 104 is a predetermined temperature by a control unit 121 by using a measured value, and as a result, the temperature of the specimen 101 to be heated may be controlled with high precision. In the embodiment, the inputted radio-frequency power is maximally set to 20 kW.

The plasma 124 of a heating source is made to plasma in a glow discharge range to form the plasma 124 uniformly dispersed between the upper electrode 102 and the lower electrode 103 and the specimen 101 which is planar may be uniformly heated by heating the specimen 101 by using the uniform and planar plasma 124 as a heat source.

Although the temperature of the heated specimen 101 is rapidly increased in that the specimen 101 may be heated planarly and uniformly, a risk which occurs due to a breakage accompanied by temperature nonuniformity in the heated specimen 101 is low. The temperature may be rapidly increased and decreased as described above and a time required for a series of heating treatments may be shortened. By the effect, a throughput of the heating treatment may be improved, and presence time of the specimen 101 under a high-temperature atmosphere beyond necessity may be shortened and SiC surface roughness accompanied by a high temperature may be reduced.

When the heating treatment is terminated, the heated specimen 101 is carried out from the transportation port 117 in a step in which the temperature of the heated specimen 101 is decreased to 800° C. or lower and the subsequent specimen 101 to be heated is transported into the heating treatment chamber 100 to be supported on the support pin 106 of the specimen stage 104 and the aforementioned heating treatment operation is repeated.

When the specimen 101 is replaced, a gas atmosphere at a specimen evacuation position (not illustrated) connected to the transportation port 117 is maintained at the same level as that in the heating treatment chamber 100, such that replacement of He in the heating treatment chamber 100 accompanied by replacement of the specimen 101 need not be performed, thereby reducing the amount of used gas.

Of course, since purity of He gas in the heating treatment chamber 100 may be decreased by repeating the heating treatment to some extent, He gas is regularly replaced at that time. When He gas is used as discharge gas, He gas is relatively high-priced gas, and as a result, the amount of used gas is maximally reduced, thereby suppressing a running cost. The amount of He gas introduced during heating treatment is set as a minimum flow required to maintain the purity of gas during treatment to thereby reduce the amount of used gas. A cooling time of the heated specimen 101 may be shortened by introducing He gas. That is, after the heating treatment is terminated (after discharge is terminated), the amount of He gas is increased to thereby shorten the cooling time by a cooling effect of He gas.

The heated specimen 101 is carried out under 800° C. or lower as described above, but a transportation arm having high heat resistance is used, such that the specimen 101 may be carried out even under 800 to 2000° C. and a standby time may be shortened.

In the embodiment, the gap 108 between the upper electrode 102 and the lower electrode 103 is set to 0.8 mm, but the same effect is achieved even in the range of 0.1 to 2 mm. Discharge is available even in the case of a gap which is narrower than 0.1 mm, but a high-precision function is required to maintain parallelism between the upper electrode 102 and the lower electrode 103. Since alteration (roughness, and the like) of the surfaces of the upper electrode 102 and the lower electrode 103 influences the plasma 124, the gap narrower than 0.1 mm is not desirable. Meanwhile, in the case where the gap 108 is more than 2 mm, ignition performance of the plasma 124 deteriorates or radiation loss from a space between the gaps is increased, which is not desirable.

In the embodiment, the pressure in the heating treatment chamber 100 for generating plasma is set to 0.6 atmospheric pressure, but the same operation is available even under the atmospheric pressure of 10 atmospheric pressure or lower. When the pressure in the heating treatment chamber 100 is higher than 10 atmospheric pressure, it is difficult to generate uniform glow discharge.

In the embodiment, as the raw gas for generating plasma, He gas is used, but the same effect may be achieved even by using gas by using inert gas such as Ar, Xe, Kr, or the like as the raw material in addition thereto. He gas used in the embodiment is excellent in plasma ignition performance or stability around the atmospheric pressure, but is high in thermal conductivity of gas and comparatively large in heat loss by the heat-transfer through the gas atmosphere. Meanwhile, gas having large mass such as Ar, Xe, Kr, or the like is low in thermal conductivity and thus is more advantageous than He gas in terms of thermal efficiency.

In the embodiment, tungsten is used as the material for the heat shield (the plate material having the high melting point and low emissivity or the coating having the high melting point and low emissivity) 109, but even though tungsten carbide (WC), molybdenum carbide (MoC), tantalum (Ta), molybdenum (Mo), or a material in which the graphite base is coated with tantalum carbide (TaC) is used, the same effect is achieved. Similarly, in the embodiment, tungsten having the thickness of 0.1 mm is used as the heat shield 109, but even though a material having a thickness of 1 mm or less is used, the same effect is achieved. A material which is thicker than 1 mm is not desirable because the heat capacity is relatively increased and further, the cost is increased.

In the embodiment, graphite is used, in which the opposite side to the surfaces of the upper electrode 102, the lower electrode 103, and the specimen stage 104 contacting the plasma 124 is coated with silicon carbide by the CVD method, but the same effect is achieved even by using single graphite, a member in which graphite is coated with pyrolytic carbon, a member in which the surface of graphite is vitrificated, and SiC (a sintered body, polycrystal, and single crystal). Graphite serving as the base of the upper electrode 102 or the lower electrode 103 or coating performed on the surface thereof desirably has high purity in terms of preventing contamination in the specimen 101.

In the heat treatment at 1200° C. or higher, contamination from the upper feed line 110 may also influence the specimen 101. Therefore, in the embodiment, the same graphite as in the upper electrode 102 and the lower electrode 103 is used for even the upper feed line 110. Heat of the upper electrode 102 is transferred to the upper feed line 110 and thereafter, lost. Accordingly, heat-transfer from the upper feed line 110 needs to be requisitely minimized.

Therefore, a cross-sectional area of the upper feed line 110 formed by graphite needs to be small and needs to have a large length, as possible. However, when the cross-sectional area of the upper feed line 110 is extremely small and the length thereof is excessively large, radio-frequency power loss is increased in the upper feed line 110 and heating efficiency of the specimen 101 to be heated deteriorates. As a result, in the embodiment, the cross-sectional area of the upper feed line 110 formed by graphite is set to 12 mm$^2$ and the length thereof is set to 40 mm based on the above viewpoint. The same effect may be acquired even when the cross-sectional area of the upper feed line 110 is in the range of 5 to 30 mm$^2$ and the length of the upper feed line 110 is in the range of 30 to 100 mm.

Heat of the specimen stage 104 is transferred to the shaft 107 and thereafter, lost. Therefore, heat-transfer from the shaft 107 also needs to be requisitely minimized like the upper feed line 110. Therefore, a cross-sectional area of the shaft 107 formed by the alumina material needs to be small and the length thereof needs to be large, as possible. In the embodiment, the cross-sectional area and the length of the shaft 107 formed by the alumina material are set to be the same as those of the upper feed line 110 by considering the strength thereof.

In the embodiment, the radiation loss from the upper electrode 102, the lower electrode 103, and the specimen stage 104 is reduced by using the heat shield 109, and the radiant light is returned to the heat shield 109 by the reflection mirror 120 to improve the heating efficiency. However, even when only the heat shield 109 is performed around the upper electrode 102, the lower electrode 103, and the specimen stage 104, the improvement of the heating efficiency may be expected. Similarly, even when only the reflection mirror 120 is installed, the improvement of the heating efficiency may be expected. The protection quartz plate 123 is installed to expect the effect of contamination prevention and sufficient heating efficiency may be acquired without using the protection quartz plate 123.

In the embodiment, heat dissipation from the upper electrode 102, the lower electrode 103, and the specimen stage 104 that influences heating efficiency primarily includes (1) radiation, (2) heat-transfer under the gas atmosphere, and (3) heat-transfer from the upper feed line 110 and the shaft 107. When heating is performed at 1200° C. or higher, the most primary heat dissipation factor among them is (1) radiation. In order to suppress (1) radiation, the reflection mirror 120 and the heat shield 109 are installed. (3) Heat dissipation from the upper feed line 110 and the shaft 107 is suppressed to be minimum by optimizing the cross-sectional areas and the lengths of the upper feed line 110 and the shaft 107 as described above.

In the embodiment, as the radio-frequency power supply 111 for generating plasma, radio-frequency power of 13.56 MHz is used, but the reason is that since 13.56 MHz is an industrial frequency, the power may be obtained at a low cost and since an electromagnetic wave leakage reference is also low, a device cost may be reduced. However, in principle, heating may be performed in the same principle at different frequencies. In particular, frequencies in the range of 1 to 100 MHz are appropriate. When the frequency is lower than 1 MHz, radio-frequency voltage at the time of supplying power required for heating is increased, abnormal discharge (unstable plasma or discharge at an area other than the space between the upper electrode and the lower electrode) is generated, and it is difficult to generate stable plasma. When the frequency is higher than 100 MHz, impedance at the gap between the upper electrode 102 and the lower electrode 103 is low, and as a result, it is undesirably difficult to acquire voltage required for generating plasma.

Figure 11:
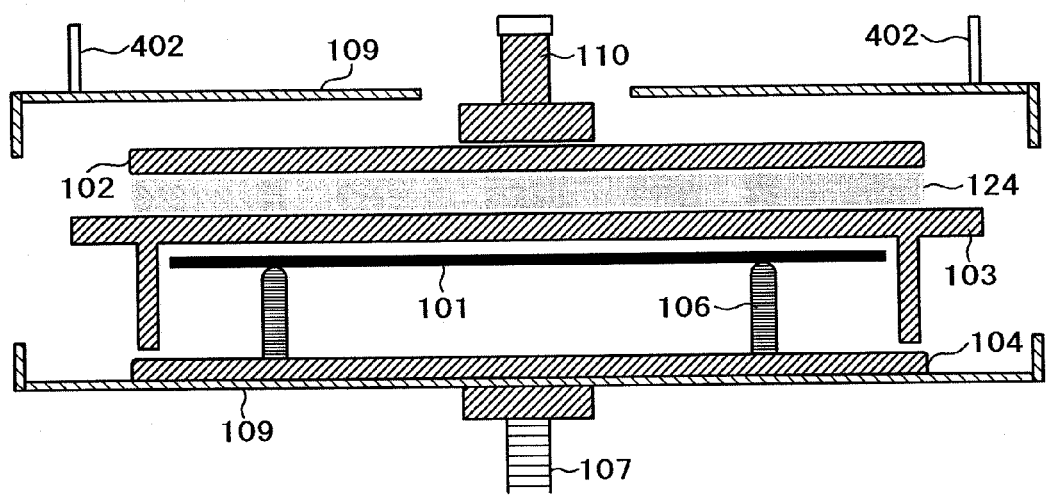
FIG. 11 is an enlarged diagram of a heating area in the heating treatment chamber of the heat treatment apparatus according to the fourth embodiment.
Figure 12:
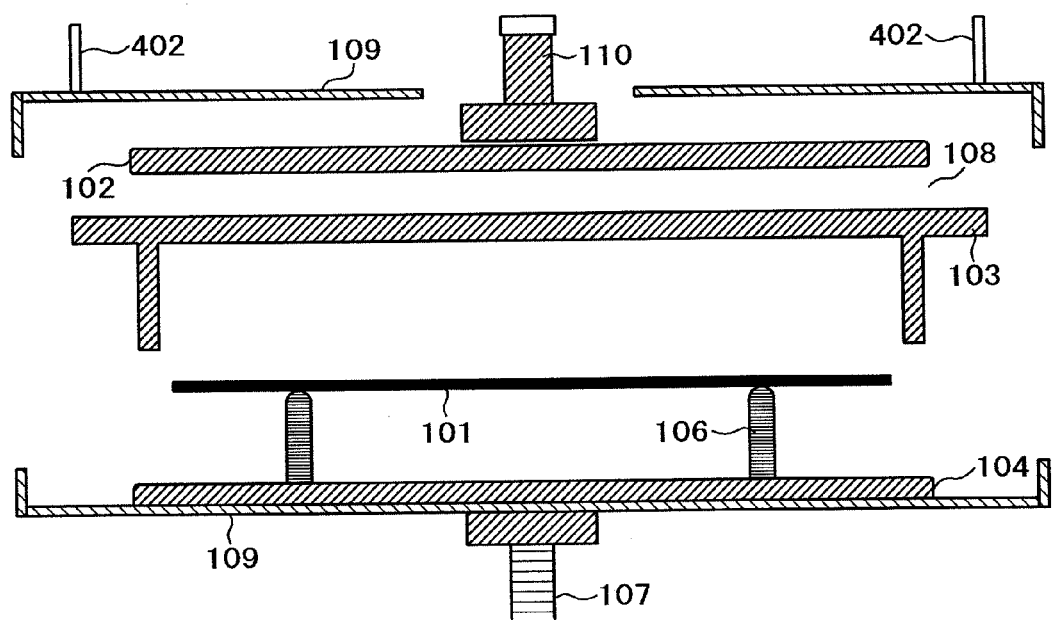
FIG. 12 is a diagram describing carry-in/out with respect to the heating treatment chamber of the heat treatment apparatus according to the fourth embodiment.

Subsequently, a method of carrying the specimen 101 in/from the heating treatment chamber 100 will be described with reference to FIGS. 11 and 12. FIGS. 11 and 12 are detailed diagrams of the heating area of the heating treatment chamber 100. FIG. 11 illustrates a state in which heating is in progress and FIG. 12 illustrates a state in which the specimen 101 is carried in and out.

In the case of carrying out the specimen 101 supported on the support pin 106 of the specimen stage 104, the plasma 124 is stopped from the heating state of FIG. 11 and the specimen stage 104 is moved down by the vertical mechanism 105, such that an end between the specimen 101 and the specimen stage 104 with a gap formed therebetween is opened as illustrated in FIG. 12. A transportation arm (not illustrated) is horizontally inserted into the gap from the transportation port 117 and the vertical mechanism 105 is moved down, such that the specimen 101 is guided to the transportation arm to be carried out. In the case of carrying the specimen 101 to be heated into the heating treatment chamber 100, the specimen 101 to be heated may be carried into the heating treatment chamber 100 by performing a reverse operation to carrying out the aforementioned specimen.

While the support pin 106 of the specimen stage 104 is moved down in the vertical mechanism 105, the specimen 101 to be heated is transported from the transportation arm (not illustrated) mounted with the specimen 101 to be heated onto the support pin 106. Thereafter, the specimen stage 104 is moved up by the vertical mechanism 105 and the specimen stage 104 receives the specimen 101 to be heated from the transportation arm. After the transportation arm is carried out, the specimen stage 104 is additionally moved up to a predetermined position for heating to make the specimen 101 to be heated come close to the lower part of the lower electrode 103 serving as the heating plate.

In the embodiment, since the upper electrode 102 and the lower electrode 103 are fixed, the gap 108 is not varied. As a result, the stable plasma 124 may be generated whenever the specimen 101 is heated.

As described above, the SiC substrate injected with ions is heated at 1500° C. for 1 minute by using the aforementioned heating treatment apparatus of the embodiment, and as a result, an excellent conductive characteristic may be acquired. Surface roughness does not appear on the surface of the SiC substrate. Even though the treatment is repeatedly performed, deterioration in the heat efficiency is not almost recognized.

Hereinafter, effects of the embodiment will be summarized. In the heating treatment apparatus according to the embodiment, the specimen 101 is heated by using the plasma generated between the narrow gaps as an indirect heat source. The plasma is desirably generated by the atmospheric pressure glow discharge in terms of uniformity. The following six effects which are not provided in the related art may be acquired in association with the heating principle.

A first effect is thermal efficiency. The gas between the gaps 108 has a very small thermal capacity, and the plate material 109 having the high melting point and low emissivity or the coating 109 having the high melting point and low emissivity is placed in the upper electrode 102, the lower electrode 103, and the specimen stage 104, such that the specimen 101 may be heated under a system in which heating loss accompanied by radiation is very small.

A second effect is heating responsiveness and uniformity. Since the heat capacity of the heating unit is very small, the temperature may be rapidly increased and decreased. Since the gas heating by the glow discharge is used as the heating source, uniform heating is planarly achieved by extension of the glow discharge. Nonuniformity of an in-plane device characteristic of the specimen 101 accompanied by the heating treatment may be suppressed by high temperature uniformity and damages caused by heat stress accompanied by an in-plane temperature difference of the specimen 101 when the temperature is rapidly increased may also be suppressed.

A third effect is reduction in consumed components accompanied by the heating treatment. In the embodiment, since gas contacting each of the upper electrode 102 and the lower electrode 103 is directly heated, a high-temperature area is limited to a member placed very adjacent to the upper electrode 102 and the lower electrode 103 and the temperature thereof is also equal to that of the specimen 101.

Accordingly, the life-span of the member is long and an area of replacement accompanied by deterioration in components is also small.

A fourth effect is suppression of the surface roughness of the specimen 101. In the embodiment, since it is possible to requisitely minimally shorten a time period during which the specimen 101 is exposed to a high-temperature environment in that the temperature rising time and the temperature dropping time may be shortened by the aforementioned effect, the surface roughness may be suppressed. In the embodiment, the plasma 124 by the atmospheric pressure glow discharge is used as the heating source, but the specimen 101 is not exposed directly to the plasma 124. As a result, a process of forming and removing a protection film, which is performed by an apparatus other than the heat treatment apparatus, becomes unnecessary and a manufacturing cost of a semiconductor device using the SiC substrate may be reduced.

A fifth effect is simplification of carrying the specimen 101 in/out with respect to the heating treatment chamber 100. In the embodiment, the specimen 101 may be transferred to the specimen stage 104 from the transportation arm (not illustrated) or the specimen 101 may be transferred to the transportation arm (not illustrated) from the specimen stage 104, only by operating the vertical mechanism of the specimen stage 104. Since a complicated mechanism for performing the transfer is not required, the number of constituent components in the heating treatment chamber 100 may be reduced, and as a result, a simple configuration of the apparatus may be achieved.

In a sixth effect, the improvement of the heating efficiency, and the long-term stabilization and the prevention of contamination of the specimen 101 may be achieved while the increase in the heat capacity of the heating area is minimized by the configuration of FIG. 8 in which the heat shield 109 is placed between the upper electrode 102 and the lower electrode 103, and the reflection mirror 120.

That is, as described above in each embodiment, the present invention may provide the heat treatment apparatus that indirectly heats the specimen by using the plasma as the heating source. Further, in other words, the present invention may provide the heat treatment apparatus that includes the heating treatment chamber heating the specimen, in which the heating treatment chamber includes the heating plate, the electrode opposed to the heating plate, and the radio-frequency power supply supplying the radio-frequency power for generating the plasma to the electrode, generates the plasma between the electrode and the heating plate, and indirectly heats the specimen by using the plasma generated between the electrode and the heating plate as the heating source. The plasma is desirably generated by the glow discharge.

As a result, the aforementioned effects may be expressed in each embodiment by the present invention.

The present invention is not limited to the embodiments and includes various modified examples. For example, the embodiments are described in detail in order to describe the present invention for easy understanding and are not limited to including all components of the description. Further, some of components of a predetermined embodiment can be substituted by components of another embodiment and the components of another embodiment can be added to the components of the predetermined embodiment. Other components can be added, deleted and substituted with respect to some of the components of each embodiment.

What is claimed is:

1. A heat treatment apparatus, comprising:
a heating treatment chamber in which a specimen is heated;
a first plate-shaped electrode disposed in the heating treatment chamber;
a second plate-shaped electrode facing the first electrode and disposed in the heating treatment chamber;
a radio-frequency power supply configured to supply radio-frequency power to the first electrode for generating plasma between the first electrode and the second electrode;
a specimen stage facing to the second electrode and on which the specimen is placed;
a radiant heat suppressing portion configured to suppress radiant heat;
wherein the second electrode includes a disk-shaped member which shape is substantially equivalent to the first electrode and a plurality of beams disposed outside of the disk-shaped member, and is fixed to an inner wall of the heating treatment chamber with the plurality of beams extending in a radial direction of the disk-shaped member, wherein a plurality of gaps bounded by the inner wall of the heating treatment chamber and the disk-shaped member are separated by the plurality of beams,
the heating treatment chamber is divided by the second electrode into a first heating treatment part in which the first electrode is placed and a second heating treatment part in which the specimen stage is placed,
the first heating treatment part communicates with the second heating treatment part through the gaps,
the radiant heat suppressing portion comprises a first radiant heat suppressing part surrounding the first electrode and configured to suppress radiant heat radiated from the first electrode and a second radiant heat suppressing part disposed on the specimen stage and configured to suppress radiant heat radiated from the second electrode, and
a diameter of the second radiant heat suppressing part is larger than a diameter of the disk-shaped member.

2. The heat treatment apparatus according to claim 1, wherein a base material or the surface of the radiant heat suppressing portion is tungsten, tantalum, molybdenum, tungsten carbide, tantalum carbide, or molybdenum carbide.

3. The heat treatment apparatus according to claim 1, wherein a base material of the first electrode, a base material of the second electrode, and a base material of the specimen stage are all graphite.

4. The heat treatment apparatus according to claim 1, further comprising a reflection mirror surrounding the first electrode, the second electrode and the specimen stage and reflecting radiant heat radiated from the first electrode and radiant heat radiated from the second electrode, wherein the reflection mirror is disposed outside of the radiant heat suppressing portion.

5. The heat treatment apparatus according to claim 4, wherein the second electrode is in conduction with the reflection member through the beams.

* * * * *